US006097749A

United States Patent [19]

Naoe et al.

[11] Patent Number: 6,097,749

[45] Date of Patent: Aug. 1, 2000

[54] LIGHT SOURCE DEVICE INCLUDING SEMICONDUCTOR LASERS

[75] Inventors: Yasuhiro Naoe; Hiroyuki Okuwaki; Osamu Kawazoe, all of Kanagawa, Japan

[73] Assignee: Ricoh Company, Ltd., Tokyo, Japan

[21] Appl. No.: 09/055,902

[22] Filed: Apr. 7, 1998

[30] Foreign Application Priority Data

| | | | |
|---|---|---|---|
| Apr. 7, 1997 | [JP] | Japan | 9-088136 |
| Apr. 7, 1997 | [JP] | Japan | 9-088137 |
| Nov. 20, 1997 | [JP] | Japan | 9-334885 |

[51] Int. Cl.[7] .................... H01S 3/08

[52] U.S. Cl. .................... 372/103; 372/101; 372/107; 372/108; 372/65

[58] Field of Search .................... 372/101, 103, 372/107, 108, 65

[56] References Cited

U.S. PATENT DOCUMENTS

| | | | |
|---|---|---|---|
| 4,661,959 | 4/1987 | Kanekop | 372/103 |
| 4,677,629 | 6/1987 | Lesh | 372/103 |
| 4,918,702 | 4/1990 | Kimura | 372/108 |
| 5,048,050 | 9/1991 | Komurasaki | 372/101 |
| 5,381,438 | 1/1995 | Guo et al. | 372/101 |
| 5,448,587 | 9/1995 | Huangh | 372/107 |
| 5,504,350 | 4/1996 | Ortyn | 372/101 |
| 5,600,666 | 2/1997 | Hiiro | 372/101 |
| 5,661,747 | 8/1997 | Hiiro | 372/101 |

*Primary Examiner*—Leon Scott, Jr.
*Attorney, Agent, or Firm*—Oblon, Spivak, McClelland, Maier & Neustadt, P.C.

[57] ABSTRACT

A cost-effective and accurate light source deice for use in an image forming apparatus and including semiconductor lasers is disclosed. The device needs only a minimum number of parts, obviates displacements during assembly, and allows collimator lenses to be adhered by photo-curable adhesive. Even when temperature around the device varies, the distance between the semiconductor lasers in a beam pitch direction varies little.

27 Claims, 28 Drawing Sheets

41
41a
41b
41c
41d
41e
42
43
44
44a
45
X
Y
Z 52b
52a
55
55
54
54d
54b
54d
54a
54c
54e
51g
51
51g
51d
51f
51b
51a
51d
51e
51c
51g
51g
53a
53b
59a
59
59b
60
X
Y
Z 11
2
1a
1d
1
1c
1b
3
4
4a
10
5
9
9a
X
Y
Z

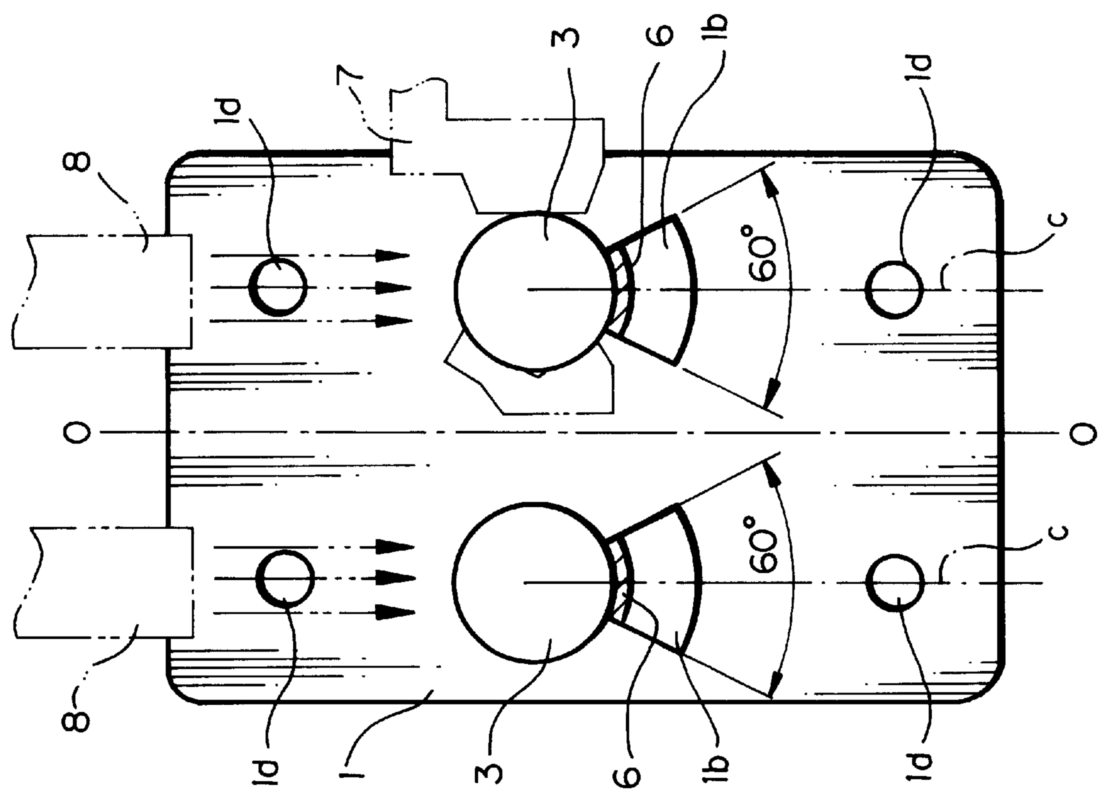
Fig. 8
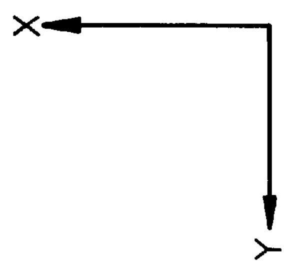

2
2
11
C
C'
C
1d
1
1a
1c
1a
1b
1b
3
3
4
4a
10
10
5
9
9a
X
Y
Z
10
10

1
1a
1d
3
5
23b
X
Z
Y
10
10
23
3
1d

8
X
3
5
7
Y
6
23b
23a
24
23
1

11
2
11
1a
1c
1d
1
1a
1b
1b
1d
23
23c
3
3
5
10
10
25b
25a
25b
25
9
X
Y
Z
10
10

11
2
1d
1
1c
1a
26
26a
23a
3
1b
23b
23
10
5
9
X
Y
Z

X
Z
Y
1a
1
3
5
1d
10
10
26a
26
3

8
26(5)
3
X
26a
7
Y
3
26a
3
23
6
24

1
2
2
11
11
3
3
1b
27a
27b
27
27a
5a
5
9a
9
28
5b
10
10
X
Y
Z 11
2
30
30a
30b
30c
30d
3
4
4a
10
5
9
X
Y
Z 11
11
31a
31
31
11
2
2
1d
1
1c
1a
1a
1b
1b
1d
3
3
4
10
4a
10
5
9
X
Y
Z
10
10
10

EXPANSION OF ADHESIVE LAYER (ΔS)
EXPANSION OF BASE (ΔL/2)
1b
3
1
δ
L
δ
CENTER OF LENS SUPPORT PORTION
CENTER OF COLLIMATOR LENS
CENTER OF LENS SUPPORT PORTION
CENTER OF LENS SUPPORT PORTION
3
1b 34b
34a
1f
34a
34b 34
34c
1f
34b
1
34a
9

LIGHT SOURCE DEVICE INCLUDING SEMICONDUCTOR LASERS

BACKGROUND OF THE INVENTION

The present invention relates to a light source device for use in an image forming apparatus and including a semiconductor laser, particularly a plurality of semiconductor lasers.

A light source device including a semiconductor laser and a collimator lens is extensively used in a digital copier, laser printer, facsimile apparatus or similar image forming apparatus. As for optical characteristics, the light source device is required to have the directionality (optical axis characteristic) and parallelism (collimation characteristic) of a laser beam to issue from the device. To satisfy such characteristics, it is a common practice to adjust the emission point of the laser and the collimator lens relative to each other in the directions of three axes x, y and z. The required positional accuracy is less than the order of micron. Therefore, the light source device of the type described should be adjustable in position in the three directions x, y and z and should be fixed in place at its adjusted position.

Adhesive used to affix the collimator lens contracts during curing. It is therefore necessary to reduce the adverse influence of the contraction on the optical characteristics. Particularly, the accuracy of the light source device is severely restricted in the direction z (optical axis direction), so that the device must be so constructed as to obviate the contraction in the direction z. It is therefore preferable that the adhesive layer be substantially parallel to the optical axis or z axis, and that the contraction be limited to one of the x axis direction and y axis direction in order to facilitate adjustment.

Light source devices using a semiconductor laser and a collimator lens are taught in, e.g., Japanese Patent Laid-Open Publication Nos. 5-88061, 5-136952, and 5-273483. The conventional light source devices, however, have some problems left unsolved, as follows.

(1) The devices are expensive because they need a number of parts.

(2) Displacements occur in the three directions x, y and z during assembly, lowering the accuracy of directionality of the laser.

(3) To affix the collimator lens, use cannot be made of photo-curable adhesive capable of curing rapidly in a desired configuration and having high reliability.

On the other hand, a multibeam scanning device capable of scanning a photoconductive element with a plurality of laser beams is available with a digital copier, laser printer or similar image forming apparatus. This type of scanning device includes a plurality of semiconductor lasers arranged in the subscanning direction. Laser beams issuing from the lasers are so combined as to lie on optical axes adjoining each other, and then output in one direction. A light source device for use in such a scanning device is, of course, required to have an accurate beam pitch, i.e., distance between the laser beams in the direction y.

Light source devices for emitting a plurality of laser beams are disclosed in, e.g., Japanese Patent Laid-Open Publication Nos. 7-181410 and 7-181412. However, the devices taught in these documents have the following problem (4) in addition to the problems (1)–(3).

(4) The beam pitch of the semiconductor lasers cannot be accurately maintained due to the variation of temperature around the light source device.

The conventional light source devices have problems to be discussed later in addition to the problems (1)–(4).

SUMMARY OF THE INVENTION

It is therefore an object of the present invention to provide a cost-effective and accurate light source device needing a minimum number of parts, obviating displacements during assembly, and allowing collimator lenses to be affixed by photo-curable adhesive.

It is another object of the present invention to provide a light source device allowing a minimum of variation to occur in the distance between semiconductor lasers in the beam pitch direction even when temperature around the device varies.

In accordance with the present invention, a light source device includes a base formed with a plurality of through bores. A plurality of semiconductor lasers are positioned at the rear side of the base, and each is received in the respective through bore of the base. A plurality of collimator lenses are respectively adhered to a plurality of lens support portions formed on the front side of the base. The collimator lenses each is positioned coaxially with the optical axis of the respective semiconductor laser. A plurality of apertures each shapes a laser beam to issue from the respective collimator lens. A beam combining optical element combines laser beams to respectively issue from the semiconductor lasers to thereby output laser beams lying substantially on a single optical axis. The lens support portions each has a center line extending substantially perpendicularly to a beam pitch direction of the laser beams output from the collimator lenses.

Also, in accordance with the present invention, a light source device is made up of a plurality of semiconductor lasers, a base formed with through bores for respectively press-fitting the semiconductor layers, a plurality of lens support portions formed on the base, a plurality of collimator lenses respectively adhered to the lens support portions via adhesive layers, an optical element for combining laser beams output from the collimator lenses to thereby produce beams adjoining each other, and a case mounted to the base for covering the collimator lenses and optical element. The adhesive layers each has a center thereof shifted outward of the respective bore in a beam pitch direction, so that the adhesive layers each thermally expands inward.

BRIEF DESCRIPTION OF THE DRAWINGS

The above and other objects, features and advantages of the present invention will become apparent from the following detailed description taken with the accompanying drawings in which:

FIG. 8 is a front view showing a method of affixing collimator lenses to a base included in the third embodiment;

DESCRIPTION OF THE PREFERRED EMBODIMENTS

Figure 1:
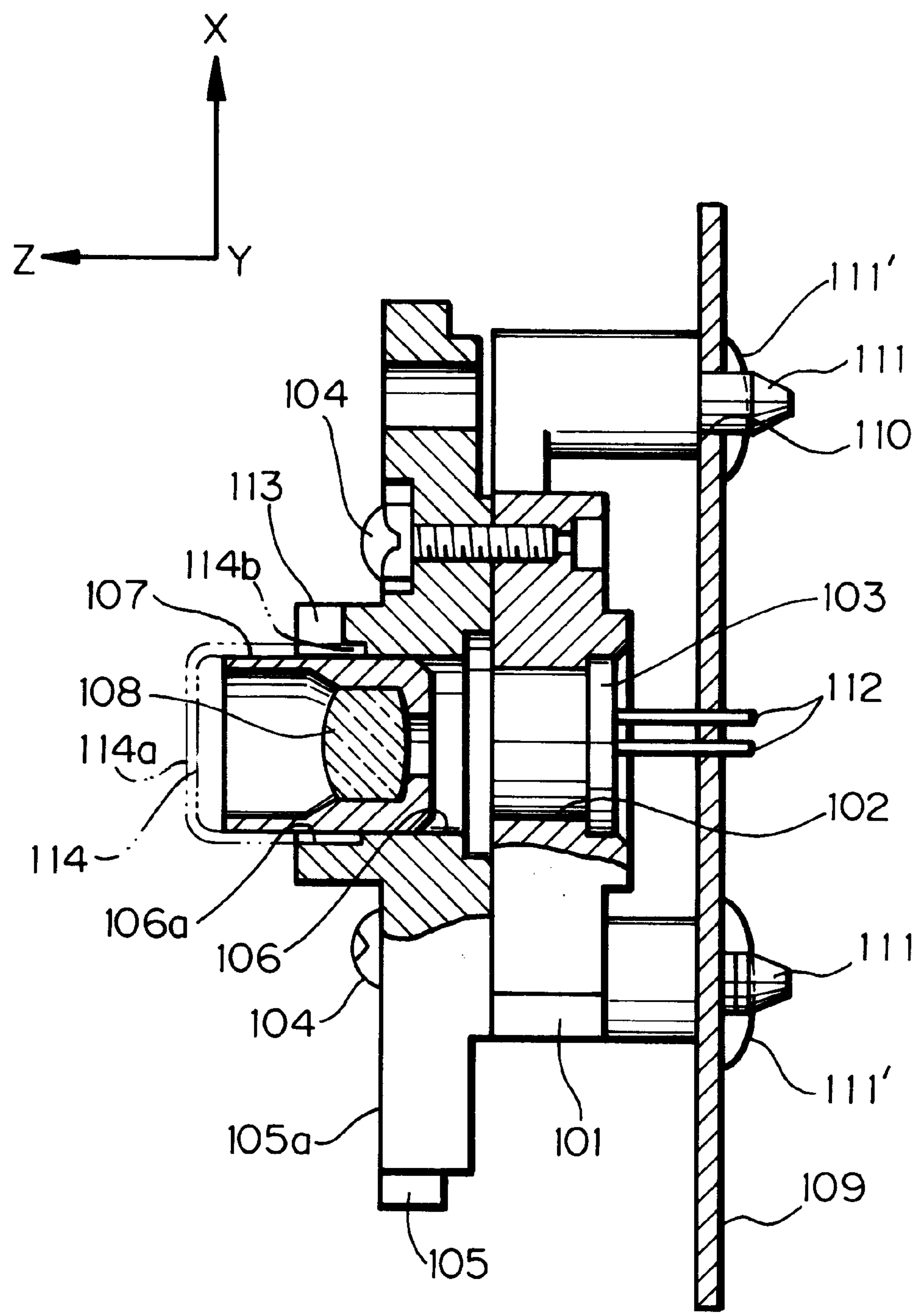
FIG. 1 is a section showing a conventional light source device.

To better understand the present invention, reference will be made to a conventional light source device including a semiconductor laser and a collimator lens, shown in FIG. 1. The light source device to be described is taught in Japanese Patent Laid-Open Publication No. 5-88061 mentioned earlier and emits a single laser beam. As shown, the device includes a base 101 formed with a stepped hole 102. A semiconductor laser 103 is press-fitted in the stepped hole 102. A flange 105 is fastened to the base 101 by two screws 104 and formed with a through bore 106 aligning with the stepped hole 102. The left end of the bore 106, as viewed in FIG. 1, is implemented as an inlet portion 106*a* greater in diameter than the other portion by about 0.1 mm. A hollow cylindrical lens holder 107 is received in the bore 106, but spaced from the wall of the bore 106 by about 0.01 mm to 0.03 mm. A collimator lens 108 is held in the lens holder 107 for converting a laser beam to a parallel beam.

A printed circuit board 109 is formed with a positioning hole 110. A guide pin 111 protrudes from the end face of the base 101 and is received in the hole 110. The tip of the guide pin 111 is melted by heat and crushed thereby, as indicated by a phantom line 11', thereby affixing the base 101 and printed circuit board 109 to each other. Leads 112 extending out from the laser 103 are passed through holes formed in the circuit board 109 and soldered to a wiring pattern provided on the rear of the circuit board 109.

The flange 105 is positioned in the directions x and y such that the emission point of the laser 103 aligns with the optical axis of the collimator lens 108. Thereafter, the flange 105 is affixed to the base 101 by the screws 104. The flange 105 is formed with a notch 113 communicated to the inlet portion 106*a*. After the lens holder 107 has been adjusted in the direction x so as to bring the light source position of the laser 103 into alignment with the focus of the collimator lens 108, adhesive is filled in the bore 106 via the notch 113 in order to affix the lens holder 107 to the flange 105.

An aperture forming member 114 is a shield cap for separating and shaping only the center portion of the beam output from the collimator lens 108. The member 114 is formed with an aperture 114*a* for selecting the above portion of the beam and a lug 114*b* mating with the flange 113. In this condition, the member 114 is affixed to the flange 105.

When the above light source device is mounted to, e.g., the body of a digital copier or that of a laser printer, a flat surface 105*a* included in the flange 105 and perpendicular to the optical axis is used as a reference surface. In addition, the surface 105 serves as a reference surface for the adjustment of optical characteristics.

The laser beam issuing from the laser 103 is collimated by the collimator lens 108. The center portion of the resulting parallel beam is passed through the aperture 114*a* of the aperture forming member 114. The beam output via the aperture 114*a* is incident to a photoconductive element via a polygonal mirror or similar deflector and an f-theta lens or similar optical element so as to form an image on the photoconductive element, although not shown specifically.

The light source device having the above configuration has the following problems (1)–(6).

(1) The adjusting portion assigned to the directions x and y (optical axis characteristic) and the adjusting portion assigned to the direction z (collimation characteristic or focal direction) each has an independent structure. This increases the number of parts and the cost of the device.

(2) The laser beam issuing from the laser 103 has a certain spread and is not always entirely incident to the collimator lens 108. Semiconductor lasers are standardized by laws from the safety standpoint. A beam issuing from a semiconductor laser should preferably be prevented form leaking in directions other than the direction of the optical axis, not only during actual operation but also during adjustment. That is, the flange 105 and base 101 must be formed of materials capable of shielding the laser beam.

(3) The adhesive used to affix the lens holder 107 should advantageously be implemented by ultraviolet (UV)-curable adhesive. UV-curable adhesive cures rapidly and reduces the production tact and is reliable. However, because the base 101 and flange 105 are opaque for UV rays, UV rays radiated via the clearance filled with the UV-curable adhesive cannot be evenly incident to the entire adhesive, resulting in irregular curing or local curing. Consequently, a strain ascribable to contraction acts on the assembly unevenly and displaces the lens holder 107 and causes the structural elements to crack. A material opaque for infrared rays, red light or similar laser beam is also opaque for UV rays shorter in wavelength than the laser beam. To allow such a material to transmit only UV rays, it is necessary to add a special filter to the assembly or provide the flange 105 itself with a special coating. This noticeably increases the cost of the assembly. It follows that the adhesive for affixing the collimator lens 108 cannot be implemented by UV-curable adhesive.

(4) The adhesive exists on the entire circumference of the lens holder 107, i.e., in the directions x, y and z. Therefore, the contraction of the adhesive during curing is not definite in the directions x or y, resulting in a scatter in the positional accuracy in the directions x and y. To guarantee positional accuracy after adhesion, it is necessary to provide the initial position with some offset taking account of the contraction. However, if the directions of contraction are not constant, it is difficult to provide the initial position with an offset and prevent accuracy in the directionality of the laser (optical axis characteristic) from falling.

(5) After the adjustment in the directions x and y, the flange 105 is affixed to the base 101 by the screws 104. This is undesirable because screw seats formed on the end face of the base 101 and the flange 105 bite each other when the screws 104 are driven. As a result, displacements in the directions x and y are apt to occur and lower the accuracy of the directionality of the laser.

(6) Because the adhesive is introduced into the clearance via the notch 23, a strain and therefore a scatter in the positional accuracy occurs due to the partial contraction of the adhesive during the inflow of the adhesive or the irregular flow of the adhesive.

Figure 2:
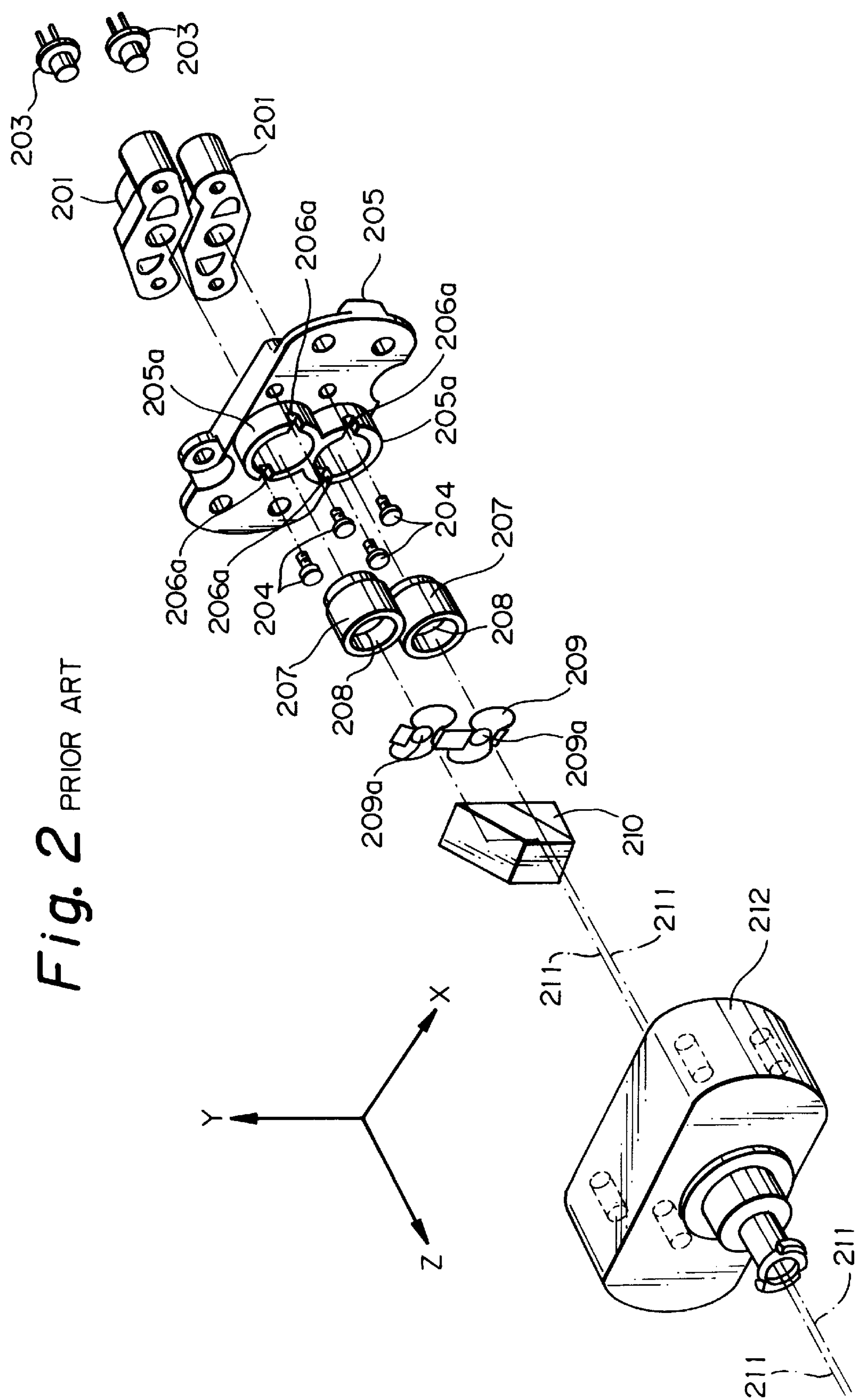
FIG. 2 is an exploded perspective view showing another conventional light source device.

FIG. 2 shows a light source device of the type emitting a plurality of (two) beams and taught in each of Japanese Patent Laid-Open Publication Nos. 7-181410 and 7-181412 also mentioned earlier. As shown, the light source device includes two bases 201 each having a stepped hole like the base 101 of FIG. 1. Two semiconductor lasers 203 are respectively press-fitted in the two stepped holes. The bases 201 are fastened to a flange 205 by four screws 204. Through bores 205*a* are formed in the flange 205 in alignment with the semiconductor lasers 203. Hollow cylindrical lens holders 207 each is received in the respective bore 205*a,* but spaced from the wall of the bore 205*a* by about 0.01 mm to 0.03 mm. Each lens holder 207 has a collimator lens 208 thereinside for converting a laser beam to a parallel beam. The bases 201 each is adjusted in the directions x and y such that the emission point of the respective laser 203 aligns with the optical axis of the associated collimator lens 208. Then, the bases 201 are affixed to the flange 205 by the screws 204.

The bores 205*a* of the flange 205 each is formed with notches 206*a*. After the lens holders 207 have been so adjusted in the direction z as to bring the emission points of the lasers 203 into alignment with the focuses of the associated collimator lenses 208, adhesive is fed via the notches 206*a* in order to affix the lens holders 207 to the flange 205.

Aperture forming members 209 each separates and shapes the center part of the beam output from the associated collimator lens 208. Each aperture forming member 209 is formed with an aperture 209*a* aligning with the optical axis of the parallel beam output from the associated collimator lens 208. The parallel beams output from the apertures 209*a* are combined by a beam combining prism 210 to turn out beams 211 existing on substantially the same optical axis. The angles of the output optical axes are finely adjusted such that the two beams 211 have a pitch implementing a desired pitch in the subscanning direction on an image forming plane (i.e., pitch in the direction of lines in the case of simultaneous two-line writing). This method corresponds to the adjustment of the bases 201 in the direction y.

As shown in FIG. 2, the aperture forming members 209 and prism 210 are received in a case 212. The case 212 is positioned by the bores 205*a* of the flange 205 and positioning portions, not shown, included in the case 212, and then affixed to the flange 205 via screw holes formed in its four corners. The flange 205 is formed of metal (particularly aluminum) in order to prevent the heat radiation of the lasers 203 and the adjusted beam pitch from being effected as far as possible. The case 212 is implemented as a resin molding from the cost standpoint.

The light source device shown in FIG. 2 has the following problems (1)–(3).

(1) The characteristic of the adhesive after curing is equivalent to the characteristic of resins in general. Usually, the coefficient of linear expansion of resin becomes greater than that of metal, causing resin to contract noticeably in the event of temperature variation. Even when the bases 201 and flange 205 are formed of metal having a small coefficient of linear expansion, the adhesive layers intervening between the collimator lenses 208 cause the pitch or distance between the lenses 208 to vary noticeably when temperature varies. This varies the angles of the beams 211 output from the prism 210 and the distance between them and therefore the pitch on the image writing plane in the subscanning direction, thereby deteriorating image quality.

(2) The adhesive layers exist on the entire circumferences of the collimator lenses 208. Therefore, when each collimator lens 208 adjusted in the direction z (collimation characteristic) is affixed by the adhesive, it is displaced due to contraction in both of the directions x and y. As a result, the positional accuracy (optical axis accuracy) of each lens 208 varies in the directions x and y after the adhesive has cured. To adjust the distance between the two beams 211 with higher accuracy, it is necessary to loosen the screws of either one of the bases 201 after the fixation of the lenses 208, again adjust the position in the directions x and y (particularly y), and then drive the screws in order to affix the base 201 to the flange 205. However, while the required accuracy in the direction z (collimation characteristic or focal direction) is less than the order of micron, a stress occurs in the direction z in the event of fastening and brings about a displacement of the order of micron in the direction z. Consequently, this method degrades accuracy in the direction z although implementing accurate adjustment of the distance between the beams. That is, when the distance between the beams is varied on an image plane due to, e.g., the scatters of optical parts other than the light source device, and if it is adjusted via the light source device, accuracy in the direction z is deteriorated.

(3) The lasers 203 each is affixed to the respective base 201 which is, in turn, fastened to the flange 205 by the respective two screws 204. Then, the flange 205 is fastened to the case 212 by screws. This is undesirable because each part is apt to deform or move due to the fastening force, causing the beam pitch to vary.

Preferred embodiments of the light source device in accordance with the present invention will be described hereinafter.

1st Embodiment

Figure 3:
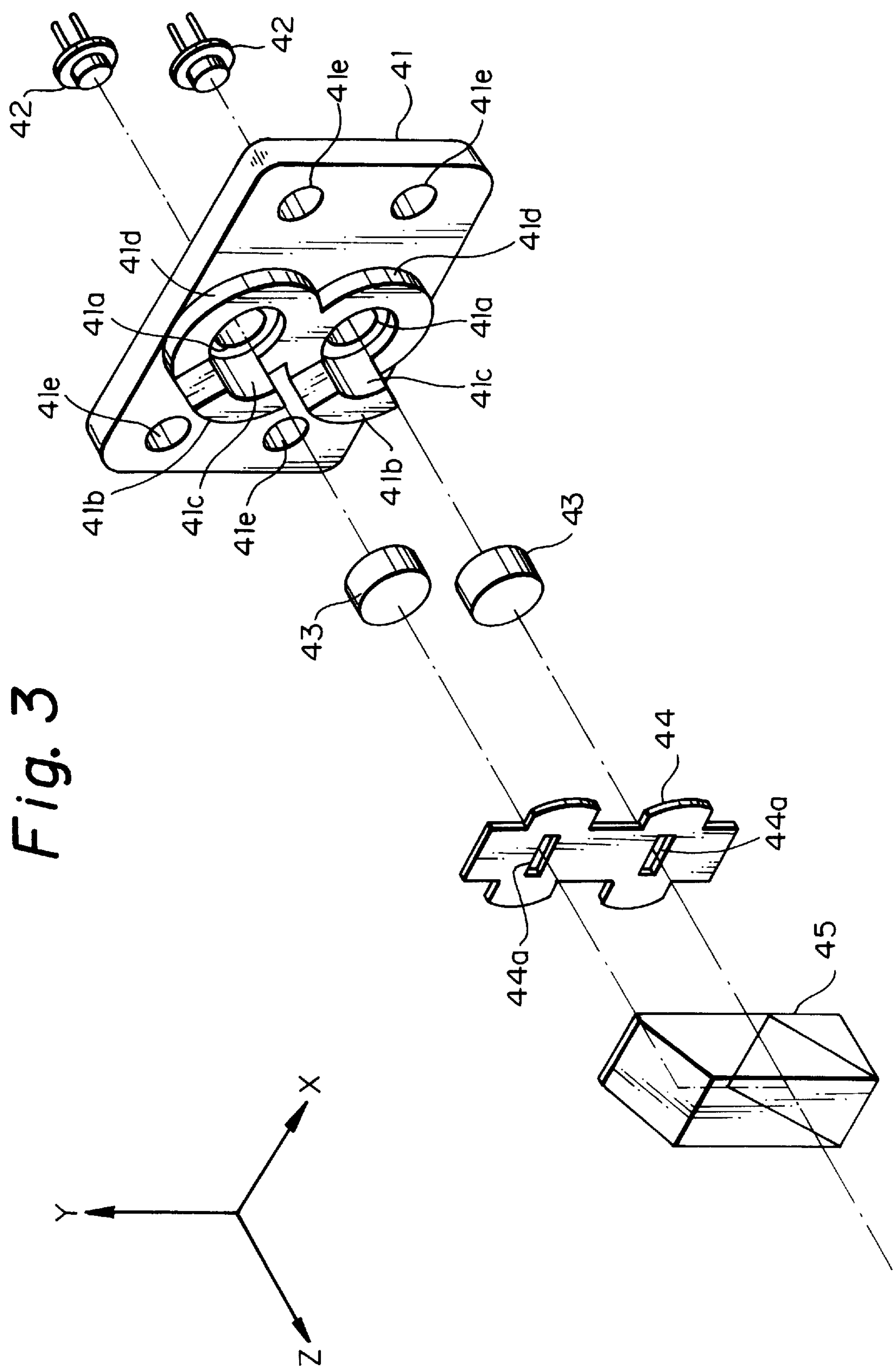
FIG. 3 is an exploded perspective view showing a first embodiment of the light source device in accordance with the present invention.
Figure 4:
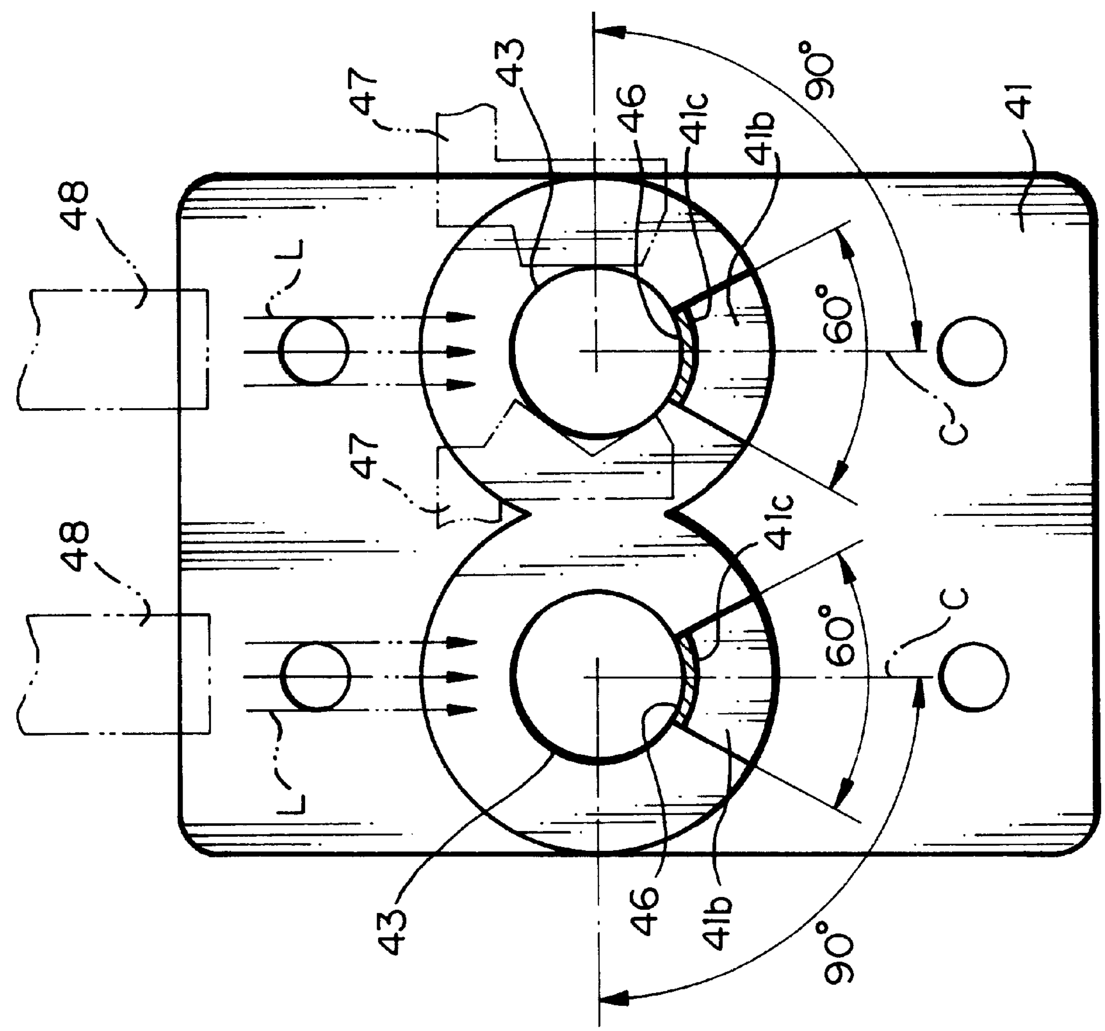
FIG. 4 is a front view showing lens support portions included in the first embodiment for supporting collimator lenses.

Referring to FIGS. 3 and 4, a light source device embodying the present invention is shown and includes a base 41 formed with two through bores 41*a*. Two semiconductor lasers 42 are respectively press-fitted in the rear parts of the bores 41*a*. In the illustrative embodiment, two collimator lenses 43 are directly adhered to the base 41. Specifically, lens support portions 41*b* are molded integrally with the front of the base 41, and each has an arcuate section slightly greater in diameter than the collimator lenses 43. The diameter of each lens support portion 41*b* may be about 0.2 mm. The lens support portions 41*b* each has an axis aligning with the optical axis of the associated laser 42. If desired, each lens support portion 41 may be provided with an arcuate section slightly greater in the radius of curvature than the collimator lens 43 by the thickness of an adhesive layer.

The lens support portions 41*b* each has a length, as measured in the direction of the optical axis (direction z), greater than the thickness of the collimator lens 43 (direction z), so that excess adhesive is prevented from deposing on unexpected portions. The portions 41*b* each has an arcuate section smaller than a semicircle, as seen in a front view. As shown in FIG. 4, the arcuate section should preferably extend over about 60 degrees and be symmetrical in the right-and-left direction with respect to a center line C in order to facilitate position adjustment and adhesion. The center lines C of the lens support portions 41*b* are substantially perpendicular to the subscanning pitch direction (direction y) of the two beams to issue from the collimator lenses 43.

The collimator lenses 43 are transparent for UV rays. While plastics and glass, for example, are transparent for UV rays, glass is desirable from the optical characteristic standpoint. As shown in FIG. 4, during assembly, each collimator lens 43 is held by a chuck 47 movable in the three directions x, y and z and then positioned on the respective lens support portion 41*b* coaxially with the associated laser 42.

UV-curable adhesive 46 is filled in a gap formed between the adhesion surface 41*c* of each support portion 41*b* and the circumference of the associated collimator lens 43. Subsequently, the collimator lens 43 is finely adjusted to its position implementing an expected optical characteristic, and then the chuck 47 is fixed in place. Thereafter, as shown in FIG. 4, UV rays L are radiated from a UV radiator 48 toward the adhesive 46 from above the collimator lens 43. The UV rays L are incident to the adhesive 46 via the collimator lens 43 and causes it to cure evenly.

The curing of the adhesive is effected with each of the two collimator lenses 43. As a result, an adhesive layer 46 is formed between the adhesion surface 41*c* of each lens support portion 41*b* and the associated collimator lens 43. The adhesive layer 46 is therefore about 0.2 mm thick and symmetrical in the right-and-left direction and has a thickness in the direction substantially perpendicular to the subscanning pitch direction (direction y). Each collimator lens 43 is affixed to the respective lens support portion 41*b* by the adhesive layer 46 while preserving its expected optical characteristic. That is, the lens support portions 41*b* are symmetrical with respect to a line perpendicular to the beam pitch direction.

Particularly, each lens support portion 41*b* has a symmetrical arcuate section extending over about 60 degrees, as shown in FIG. 4. Such a configuration allows the chuck 47 to chuck the collimator lens 43 surely and easily. In addition, the UV rays L issuing from the UV radiator 48 can illuminate the entire adhesion surface 41*c* via the collimator lens 43, insuring the even and complete curing of the adhesive. The fully set uniform adhesive layer obviates the displacement of the collimator lens 43 ascribable to irregular curing or local curing.

Because strains ascribable to the contraction of the adhesive occur symmetrically in the right-and-left direction and cancel each other, a strain occurs only in the direction x. The strain in the direction x can be provided with fine offset taking account of the contraction of the adhesive. It follows that the beams output from the two collimator lenses 43 have desirable directionality (optical axis characteristic) in the direction y, and of course have an accurate beam pitch (accuracy in the distance in the direction y or subscanning direction).

In addition, because each adhesive layer is symmetrical in the right-and-left direction or direction y, the expansion and contraction of the adhesive layer ascribable to the ambient temperature is cancelled in the direction y, i.e., limited to the direction x. This further enhances the accuracy of the distance between the two beams.

As shown in FIG. 3, an aperture forming member 44 is used to select the center portion of the parallel beam output of each collimator lens 43. For this purpose, the aperture forming member 44 is formed with two apertures 44*a* respectively aligning with the optical axes of the collimator lenses 43. The parallel beams output from the two apertures 44*a* are combined by a beam combining prism, or beam combining means, 45 to turn out beams existing on substantially the same axis. The combined beams are incident to scanning optics, not shown, for writing an image. The angles of the output optical axes are finely adjusted such that the two beams have a pitch implementing a desired pitch in the subscanning direction on an image forming plane (i.e., pitch in the direction of lines in the case of simultaneous two-line writing). This method corresponds to the adjustment of the collimator lens 43 in the direction y. If desired, the beam combining means may be implemented by a combination of a mirror and a half-mirror.

The aperture forming member 44 and prism 45 are mounted to the base 41 by a mounting member, not shown. At this instant, two contiguous circular stepped portions 41*d* are used for positioning while four holes 41*e* are used for mounting.

As stated above, the illustrative embodiment achieves various unprecedented advantages, as enumerated below.

(1) The center line C of each lens support portion 41*b* is substantially perpendicular to the direction of the pitch of two beams output from the collimator lenses 43 (direction y). Therefore, the influence of contraction of the adhesive 46 due to curing does not act in the above beam pitch direction. This, coupled with the fact that the influence of expansion and contraction of the adhesive 46 ascribable to the varying temperature does not act in the beam pitch direction, provides the light source device with an accurate beam pitch and allows it to preserve its accuracy stably.

(2) The collimator lenses 43 each is directly affixed to the respective lens support portion 41*b* molded integrally with the base 41. Therefore, the number of parts and therefore the cost of the light source device is reduced. Further, because holders or similar members do not intervene between the collimator lenses 43 and the lens support portions 41*b*, the device is free from the influence of the errors of such intermediary members. In addition, directly affixing the lenses 43 to the lens support members 41*b* obviates the need for screws or similar fastening means. The device is therefore free from displacements particular to fastening.

(3) The lens support portions 41*b* are symmetrical with respect to a line perpendicular to the beam pitch direction, so that strains ascribable to the contraction in the beam pitch direction cancel each other. This limits the contraction to the direction perpendicular to the beam pitch direction and thereby further enhances the directionality of contraction and therefore accurate position adjustment.

(4) The lens support portions 41*b* each has an arcuate section whose diameter is slightly greater than the diameter of the collimator lens 43. Therefore, when each lens support portion 41*b* and associated collimator lens 43 are positioned coaxially with each other, the adhesive layer between them has a uniform thickness and can therefore cure evenly. This protects the collimator lenses 43 from displacement. The radius of curvature of each lens support portion 41*b* greater than that of the collimator lens 43 by the thickness of the adhesive layer further enhances the above effect.

(5) Because each lens support portion 41*b* has an arcuate section smaller than a semicircle, the adhesive layer covers only less than one half of the circumference of the collimator lens 43 and gives the contraction of the adhesive 46 directionality. The initial position of the collimator lens 43 can therefore be provided with an offset taking account of the contraction of the adhesive 46 to occur, enhancing positional accuracy after the curing of the adhesive 46. In addition, light for curing the adhesive 46 can be directed toward the side ends of the collimator lenses 43 via the open sides of the lens support portions 41*b*, obviating irregular curing more positively.

(6) Gaps, grooves or similar non-adhesion portions prevent the adhesive from bridging the collimator lenses 43 and base 41 in the optical axis direction. Therefore, even when the adhesive 46 is introduced in an excessive amount, it is prevented from directly depositing on the walls of the base 41 and exerting its contracting force on the collimator lenses 43 in the direction z. This additionally increases the positional accuracy in the optical axis direction or direction z.

The UV-curable adhesive used in the above embodiment may be replaced with any other photo-curable adhesive. Also, the light source device may be so constructed as to emit three or more beams, as needed.

2nd Embodiment

Figure 5:
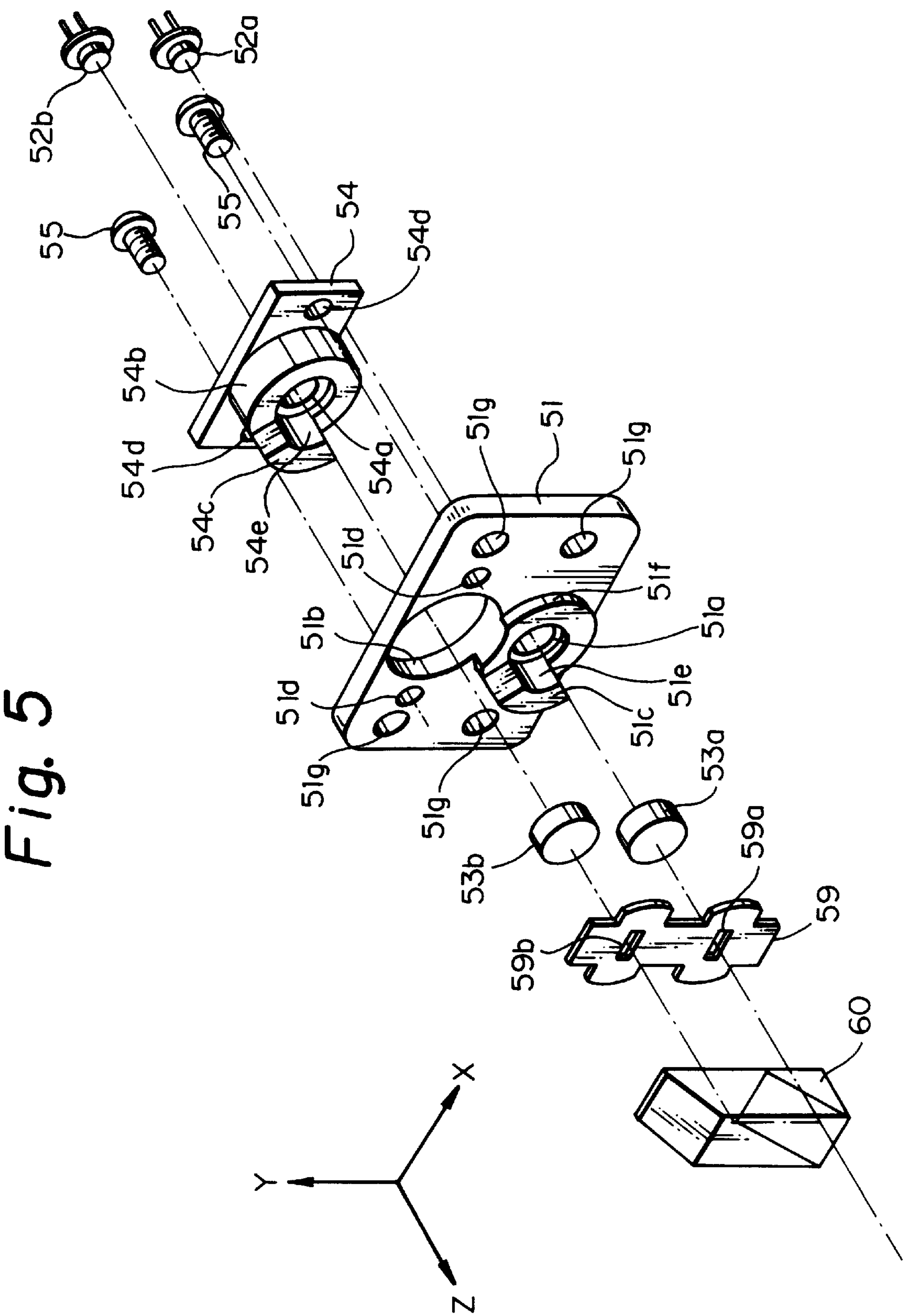
FIG. 5 is an exploded perspective view showing a second embodiment of the present invention.
Figure 6:
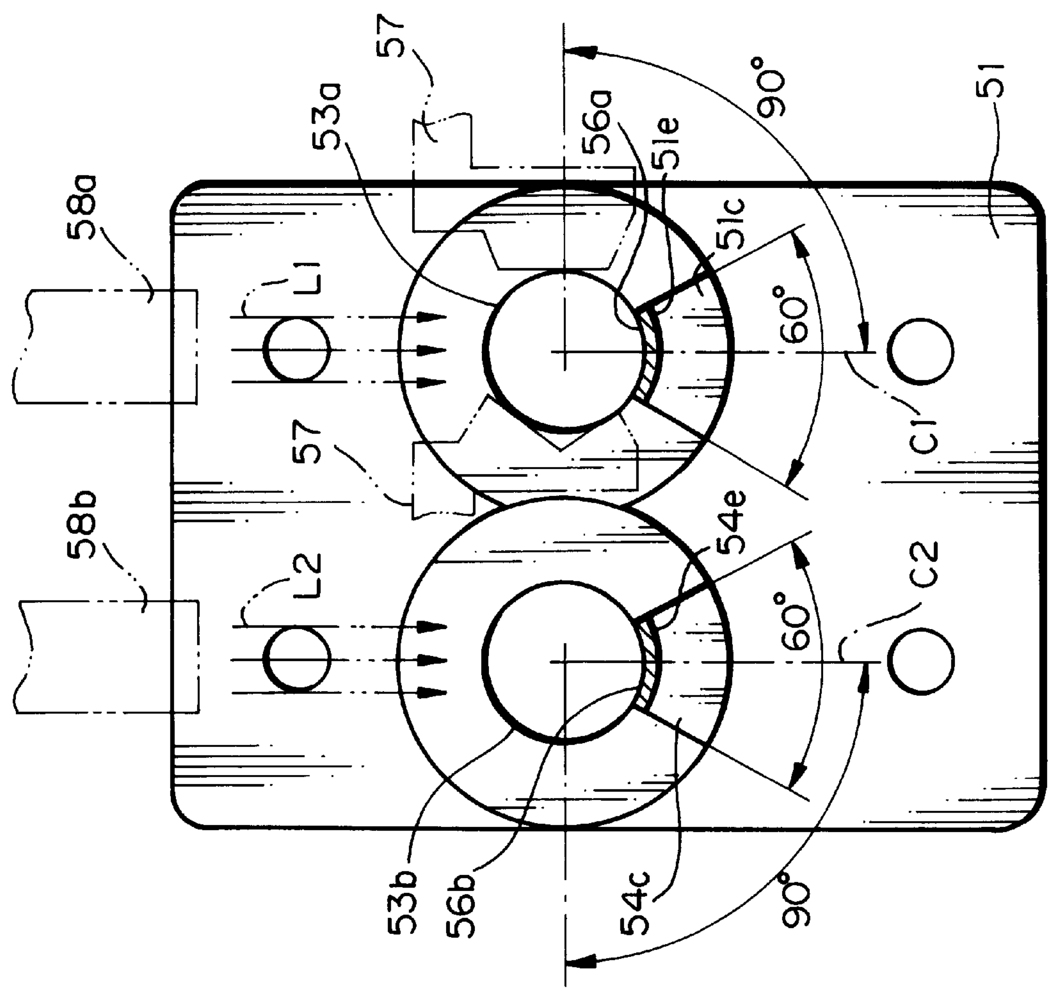
FIG. 6 is a front view showing lens support portions included in the second embodiment for supporting collimator lenses.
Figure 6:
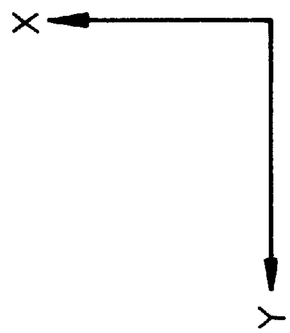

Referring to FIGS. 5 and 6, a second embodiment of the light source device in accordance with the present invention is shown and includes a first base 51 and a second base 54. The first base 51 is formed with through bores 51*a* and 51*b*. A semiconductor laser 52*a* is press-fitted in the rear part of the bore 51*a*. A collimator lens 53*a* is directly adhered to the first base 51. Specifically, a lens support portion 51*c* is molded integrally with the front of the first base 51 and has an arcuate section slightly greater in diameter than the collimator lens 53*a*. The diameter of the lens support portion 51*c* may be about 0.2 mm. The lens support portion 51*c* has an axis aligning with the optical axis of the laser 52*a*. The lens support portion 51*c* has a length, as measured in the direction of the optical axis (direction z), greater than the thickness of the collimator lens 53*a* (direction z), so that excess adhesive is prevented from deposing on unexpected portions.

The portion 51*c* has an arcuate section smaller than a semicircle, as seen in a front view. The second base 54 is formed with a through bore 54*a* and a circular stepped portion 54*b*. A semiconductor laser 52*b* is press-fitted in the rear part of the bore 54*a*. A collimator lense 53*b* is directly adhered to the second base 54. Specifically, a lens support portion 54*c* is molded integrally with the front of the base 54 and has an arcuate section slightly greater in diameter than the collimator lens 53*b*. The diameter of the lens support portion 54*c* may be about 0.2 mm. The lens support portion 54*c* has an axis aligning with the optical axis of the laser 52*b*. The lens support portion 54*c* has a length, as measured in the direction of the optical axis (direction z), greater than the thickness of the collimator lens 53*b* (direction z), so that excess adhesive is prevented from deposing on unexpected portions. The base 54 is temporarily positioned by the bore 51*b* of the base 51 and the stepped portion 54*b* of the base 54, and then fastened to the base 51 by two screws 55, holes 54*d*, and threaded holes 51*d*.

As shown in FIG. 6, the arcuate section of each of the lens support portions 51*c* and 54*c* should preferably extend over about 60 degrees and be symmetrical in the right-and-left direction in order to facilitate position adjustment and adhesion. The center lines C1 and C2 of the arcuate lens support portions 51*c* and 54*c*, respectively, are substantially perpendicular to the subscanning pitch direction (direction y) of two beams to issue from the collimator lenses 53*a* and 53*b*.

The collimator lenses 53*a* and 53*b* are transparent for UV rays. While plastics and glass, for example, are transparent for UV rays, glass is desirable from the optical characteristic standpoint. As shown in FIG. 6, during assembly, each collimator lens 53*a* or 53*b* is held by a chuck 57 movable in the three directions x, y and z and then positioned on the respective lens support portion 51*c* or 54*c* coaxially with the associated laser 52*a* or 52*b*.

UV-curable adhesive 56*a* is filled in a gap formed between the adhesion surface 51*e* of the support portion 51*c* and the circumference of the collimator lens 53*a*. Subsequently, the collimator lens 53*a* is finely adjusted to its position implementing expected optical characteristics, and then the chuck 57 is fixed in place. Thereafter, as shown in FIG. 6, UV rays L1 are radiated from a UV radiator 58*a* toward the adhesive 56*a* from above the collimator lens 53*a*. The UV rays L1 are incident to the adhesive 56*a* via the collimator lens 53*a* and causes it to cure evenly.

Adhesive 56*b* intervening between the other adhesion surface 54*e* and the collimator lens 53*b* is also caused to cure by UV rays issuing from a UV radiator 58*b*.

As a result, an adhesive layer 56*a* is formed between the adhesion surface 51*c* of the lens support portion 51*c* and the collimator lens 53*a*. The adhesive layer 56*a* is therefore about 0.2 mm thick and symmetrical in the right-and-left direction and has a thickness in the direction substantially perpendicular to the subscanning pitch direction (direction y). Likewise, an adhesive layer 56*b* is formed between the adhesion surface 54*e* of the lens support portion 54*c* and the collimator lens 53*b*. The adhesive layer 56*b* is identical with configuration with the adhesive layer 56*a*. The collimator lens 53*a* and 53*b* each is affixed to the respective lens support portion 51*c* or 54*c* by the adhesive layer while preserving its expected optical characteristic. That is, the lens support portions 51*c* and 54*c* are symmetrical with respect to a line perpendicular to the beam pitch direction.

Particularly, each lens support portion 51*c* or 54*c* has a symmetrical arcuate section extending over about 60 degrees, as shown in FIG. 6. Such a configuration allows the chuck 57 to chuck each collimator lens 53*a* or 53*b* surely and easily. In addition, the UV rays L1 and L2 issuing from the UV radiators 58*a* and 58*b,* respectively, each can illuminate the entire adhesion surface 51*e* or 54*e* via the collimator lens 53*a* or 53*b,* insuring the even and complete curing of the adhesive. The fully set even adhesive layer obviates the displacement of the collimator lens ascribable to irregular curing or local curing.

Because strains ascribable to the contraction of the adhesive occur symmetrically in the right-and-left direction and cancel each other, a strain occurs only in the direction x. The stain in the direction x can be provided with fine offset taking account of the contraction of the adhesive. It follows that the beams output from the two collimator lenses have desirable directionality (optical axis characteristic) in the direction y, and of course have an accurate beam pitch (accuracy in the distance in the direction y or subscanning direction). In addition, because each adhesive layer is symmetrical in the right-and-left direction or direction y, the expansion and contraction of the adhesive layer ascribable to the ambient temperature is cancelled in the direction y, i.e., limited to the direction x. This further enhances the accuracy of the distance between the two beams.

After the collimator lens 53*b* has been adhered to the second base 54, the base 54 can be adjusted in position in the directions x and y (particularly y) by loosening the screws 55. Therefore, when the beam pitch or distance on an image surface differs from expected one due to an extrinsic scatter, it is possible to readjust the base 54, i.e., the beam distance in any one of the directions x and y.

In the above embodiment, the second base 54 is fastened to the first base 51 first. Alternatively, after the collimator lens 53*b* has been adhered to the second base 54, the second base 54 may be affixed to the first base 51 carrying the collimator lens 53*a* therewith. This will be followed by the adjustment of the distance between the two beams.

As shown in FIG. 5, an aperture forming member 59 is used to select the center portion of the parallel beam output of each collimator lens 53*a* or 53*b*. For this purpose, the aperture forming member 59 is formed with two apertures 59*a* and 59*b* respectively aligning with the optical axes of the collimator lenses 53*a* and 53*b*. The parallel beams output from the two apertures 59*a* and 59*b* are combined by a beam combining prism, or beam combining means, 60 to turn out beams existing on substantially the same axis. The combined beams are incident to scanning optics, not shown, for writing an image. The angles of the output optical axes are finely adjusted such that the two beams have a pitch implementing a desired pitch in the subscanning direction on an image forming surface (i.e., pitch in the direction of lines in the case of simultaneous two-line writing). This method corresponds to the adjustment of the collimator lens in the direction y.

The aperture forming member 59 and prism 60 are mounted to the first base 51 by a mounting member, not shown. At this instant, the circular stepped portion 51*f* of the first base 51 is used for positioning while four holes 51*g* are used for mounting.

As stated above, the illustrative embodiment achieves the following various advantages.

(1) The first base 51 is provided with the bore 51*a* defining the optical axis of at least one beam, the semiconductor laser 52*a* received in the bore 51*a,* the collimator lens 53*a* coaxial with the laser 52*a,* and the lens support portion 51*c* also coaxial with the laser 52*a*. The second base 54 is provided with the through bore 54*a* defining the optical axis of another beam, the semiconductor laser 52*b* received in the bore 54*a,* the collimator lens 53*b* coaxial with the laser 52*b,* and the lens support portion 54*c* also coaxial with the laser 52*b*. Therefore, when a desired distance between the beams is not set up on an image writing surface due to, e.g., the scatter of any optical part other than the light source device, the distance can be adjusted without varying the characteristic of the device in the direction z (collimation characteristic), thereby insuring desirable image quality.

(2) The collimator lenses 53*a* and 53*b* are respectively directly affixed to the lens support portions 51*c* and 54*c* molded integrally with the bases 51 and 54. Therefore, the number of parts and cost of the light source device are reduced. Further, because holders or similar members do not intervene between the collimator lenses 53*a* and 53*b* and the lens support portions 51*c* and 54*c,* the device is free from the influence of the errors of such intermediary members. In addition, directly affixing the lenses 53*a* and 53*b* to the lens support members 51*c* and 54*c* obviates the need for screws or similar fastening means. The device is therefore free from displacements ascribable to fastening.

(3) The lens support portions 51*c* and 54*c* are symmetrical with respect to a line perpendicular to the beam pitch direction, so that strains ascribable to the contraction in the beam pitch direction cancel each other. This limits the contraction to the direction perpendicular to the beam pitch direction and thereby further enhances the directionality of contraction and therefore accurate position adjustment.

(4) The lens support portions 51*c* and 54*c* each has an arcuate section whose diameter is slightly greater than the diameter of the collimator lens 53*a* or 53*b*. Therefore, when each lens support portion 51*c* or 54*c* and associated collimator lens 53*a* or 53*b* are positioned coaxially with each other, the adhesive layer between them has a uniform thickness and can therefore cure evenly. This protects the collimator lenses 53*a* and 53*b* from displacement. The radius of curvature of each lens support portion 51*c* or 54*c* greater than that of the collimator lens 43 by the thickness of the adhesive layer further enhances the above effect.

(5) Because each lens support portion 51*c* or 54*c* has an arcuate section smaller than a semicircle, the adhesive layer covers only less than one half of the circumference of the collimator lens 53*a* or 53*b* and gives the contraction of the adhesive directionality. The initial position of each collimator lens 53*a* or 53*b* can therefore be provided with an offset taking account of the contraction of the adhesive to occur, enhancing positional accuracy after the curing of the adhesive. In addition, light for curing the adhesive can be directed toward the side ends of the collimator lenses 53*a* and 53*b* via the open sides of the lens support portions 51*c* and 54*c,* obviating irregular curing more positively.

(6) Gaps, grooves or similar non-adhesion portions prevent the adhesive from bridging the collimator lenses 53*a* and 53*b* and bases 51 and 54 in the optical axis direction. Therefore, even when the adhesive is introduced in an excessive amount, it is prevented from directly depositing on the walls of the bases 51 and 64 and exerting its contracting force on the collimator lenses 53*a* and 53*b* in the direction z. This additionally increases the positional accuracy in the optical axis direction or direction z.

The UV-curable adhesive used in the above embodiment may be replaced with any other photo-curable adhesive. Also, the light source device may be so constructed as to emit three or more beams.

3rd Embodiment

Figure 7:
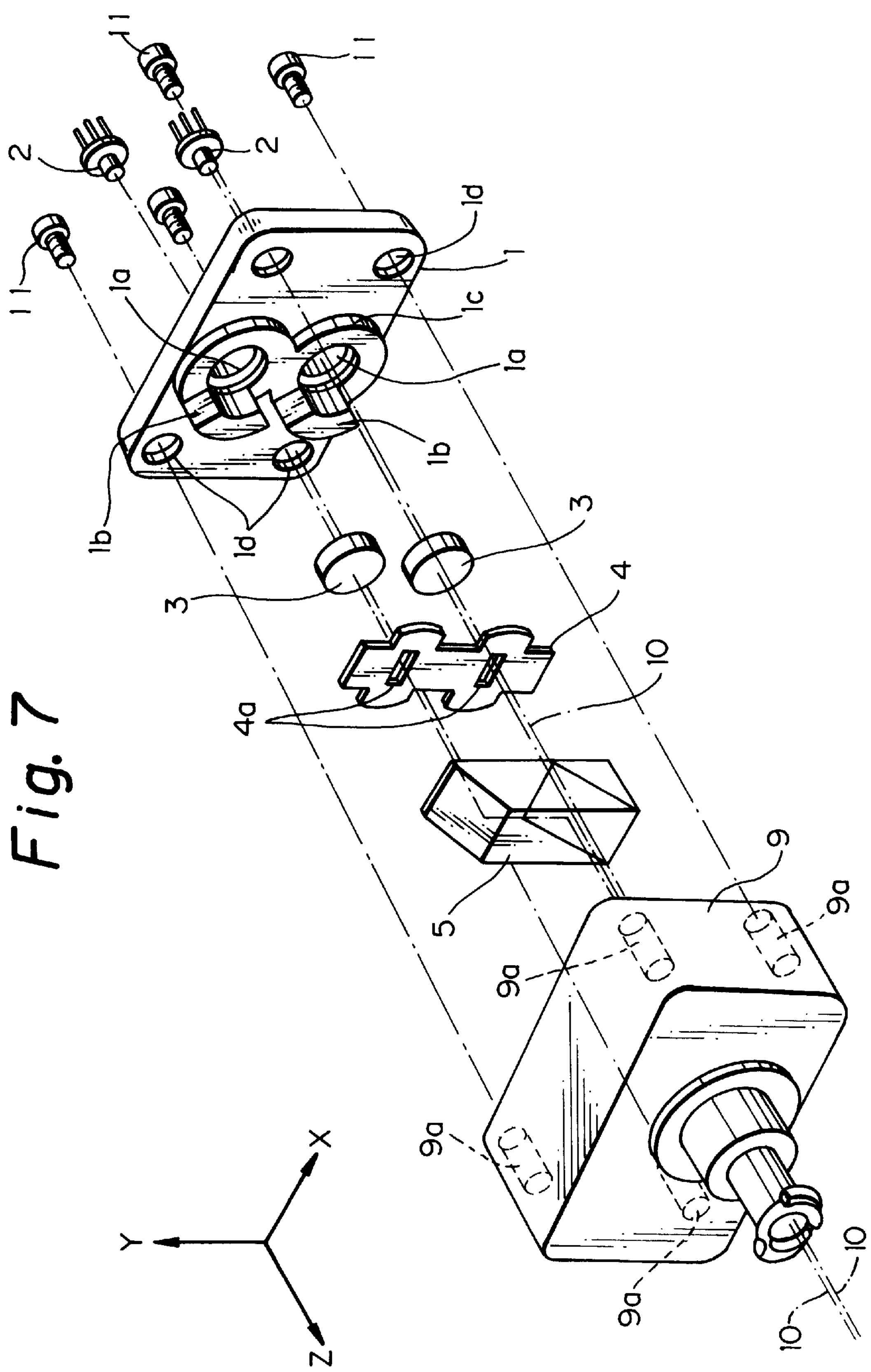
FIG. 7 is an exploded perspective view showing a third embodiment of the present invention.

Referring to FIGS. 7 and 8, a third embodiment of the light source device in accordance with the present invention is shown and includes a substantially rectangular flat base 1. Two through bores la are formed substantially at the center of the base 11 and positioned side by side in the direction y. Two semiconductor lasers 2 are respectively press-fitted in the rear parts of the bores 1*a*. Two collimator lenses 3 are directly adhered to the base 1. Specifically, lens support portions 1*b* are molded integrally with the front of the base 1, and each has an arcuate section slightly greater in diameter than the collimator lenses 3. The diameter of each lens support portion 1*b* may be about 0.2 mm. The lens support portions 1*b* each has an axis aligning with the optical axis of the associated laser 2. The lens support portions 1*b* each has a length, as measured in the direction of the optical axis (direction z), greater than the thickness of the collimator lens 3 (direction z), so that excess adhesive is prevented from deposing on unexpected portions. The portions 1*b* each has an arcuate section smaller than a semicircle, as seen in a front view.

As shown in FIG. 8, the arcuate section should preferably extend over about 60 degrees and be symmetrical in the right-and-left direction in order to facilitate position adjustment and adhesion. The center lines C of the lens support portions 1*b* are substantially perpendicular to the subscanning pitch direction (direction y) of the two beams to be output from the collimator lenses 3.

An aperture forming member 4 is formed with apertures 4*a* each for selecting a light beam and is received in a case 9. A beam combining optical member 4 is implemented as a prism capable of combining two beams 10 output via the apertures 4*a* into beams existing substantially on the same axis. The optical member 4 is also received in the case 9. If desired, the optical member 4 may be implemented as a combination of a mirror and a half-mirror As shown in FIG. 8, in the event of assembly, each collimator lens 3 is held by a chuck 7 movable in the three directions x, y and z. The chuck 7 positions the lens 7 on the associated lens support portion 1*b* coaxially with the optical axis of the associated laser 2. Subsequently, UV-curable adhesive is filled in a gap formed between the adhesion surface the lens support portion 1*b* and the circumference of the collimator lens 3, forming an adhesive layer 6. Then, the collimator lens 3 is finely adjusted to its position implementing an expected optical characteristic, and then the chuck 7 is fixed in place. Thereafter, as shown in FIG. 8, UV rays are radiated from a UV radiator 8 toward the adhesive layer 6 from above the collimator lens 3. The UV rays are incident to the adhesive layer 6 via the collimator lens 3 and cause it to cure evenly. The curing of the adhesive is effected with each of the two collimator lenses 3. As a result, the adhesive layer 46 is formed between each lens support portion 1*b* and the associated collimator lens 3. The adhesive layer 6 is therefore about 0.2 mm thick and symmetrical in the right-and-left direction and has a thickness in the direction substantially perpendicular to the subscanning pitch direction (direction y). Each collimator lens 3 is affixed to the respective lens support portion 1*b* by the adhesive layer 6 while preserving its expected optical characteristic.

The adhesive layers 6 each has a length, as measured in the optical axis direction, smaller than the length of the associated lens support portion 1*b,* so that a gap is formed between the adhesive layer 6 and the base 1. While the light source device is in operation, the adhesive layers 6 expand due to temperature elevation. At this instant, should the adhesive layers 6 and base 1 be held in close contact with each other, the collimator lenses 3 would move in the optical axis direction due to the expansion of the adhesive layers 6. The gap between each adhesive layer 6 and the base 1 allows the layer 6 to freely move to both sides of the associated lens 3 and prevents it from moving the lens 3.

The case 9 is positioned by positioning holes 1*c* formed in the base 1 and positioning recesses, not shown, formed in the case 9. After four threaded holes 9*a* formed in the case 9 and four holes 1*d* formed in the base 1 have been aligned, the case 9 is fastened to the base 1 by four screws 11.

4th Embodiment

Figure 9B:
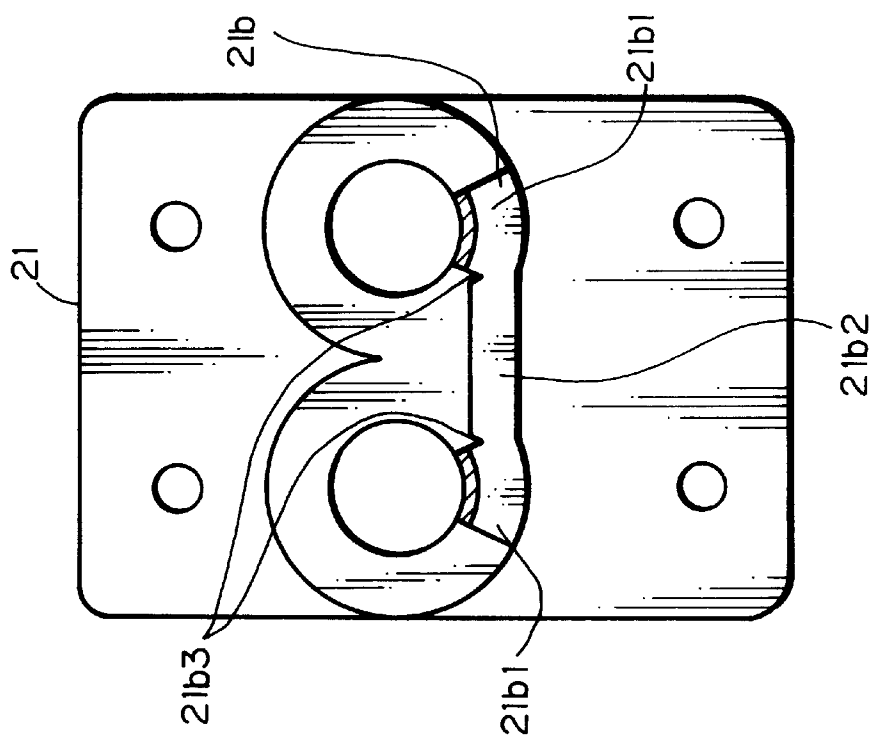
FIG. 9B is a front view of the base of FIG. 9A.
Figure 9A:
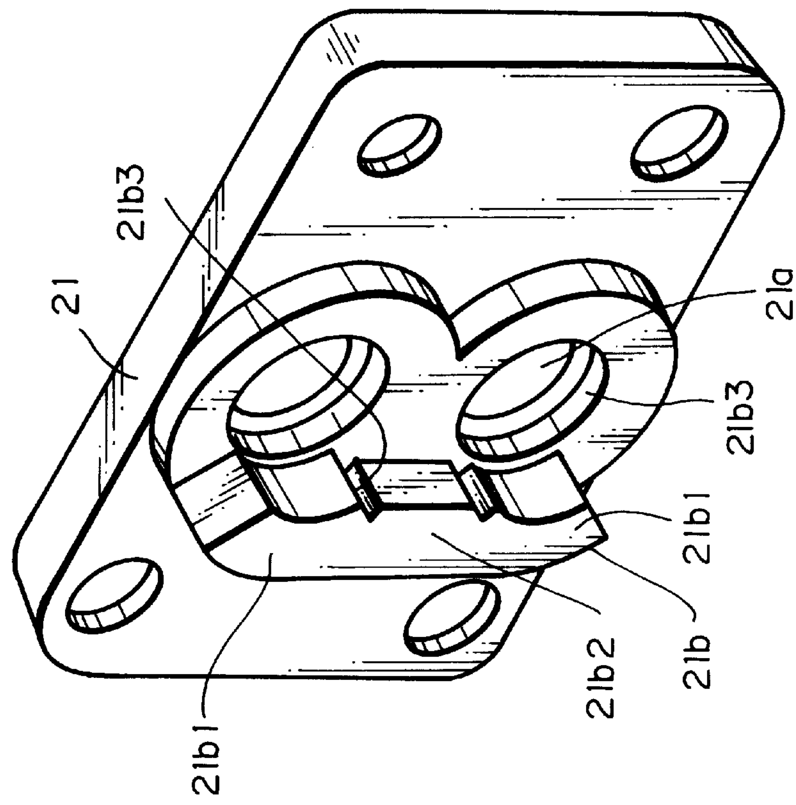
FIG. 9A is a perspective view showing a base representative of a fourth embodiment of the present invention.

FIGS. 9A and 9B show a base 21 representative of a fourth embodiment of the present invention and including a single lens support portion 21*b*. As for the rest of the construction, this embodiment is identical with the third embodiment shown in FIG. 7.

Assume that the conventional light source device shown in FIG. 2 is mounted to a digital copier or a laser printer. Then, even if the device initially has expected optical characteristics, the flange 205, for example, deforms due to a stress ascribable to assembly or expansion and contraction ascribable to temperature variation in the machine. This embodiment pertains to a light source device generally implemented as enlargement type optics. Therefore, even the slightest displacement of any part ascribable to deformation would be enlarged on reaching a writing position assigned to a photoconductive element and would turn out a noticeable displacement, critically effecting the optical characteristics. Particularly, deformation in the direction y deteriorates the parallelism of the individual laser beam.

The fourth embodiment solves the above problem by allowing a minimum of deformation to occur in the light source device. Should the machine body for accommodating the light source device be rearranged, other various portions would be effected and would bring about extra costs. In this sense, the scarcely deformable structure is desirable.

As shown in FIGS. 9A and 9B, the base 21, like the base 1 of FIG. 7, has through bores 21*a* for receiving the semiconductor lasers 2. The base 21 is characterized in that a single continuous lens support portion 21*b* is substituted for the two lens support portions 1*b*. Specifically, the lens support portion 21*b* has two lens support portions 21*b*1 connected to each other by a straight tie portion 21*b*2. The tie portion 21*b*2 is substantially parallel to the beam pitch direction or direction y and uniform in thickness in the same direction. Notches 21*b*3 are respectively formed between the lens support portions 21*b*1 and the tie portion 21*b*2, and each extends in the optical axis direction. The notches 21*b*3 prevent adhesive from reaching the tie portion 21*b*2 when it is filled for affixing the collimator lenses 3. The lens support portions 21*b*1 are symmetrical with each other with respect to the tie portion 21*b*2.

Because the tie portion 21*b*2 extends in the direction y, it prevents the base 21 from deforming in the direction y and thereby effectively obviates errors in the distance between the two beams 10 and the angle of the individual beam.

Figure 10:
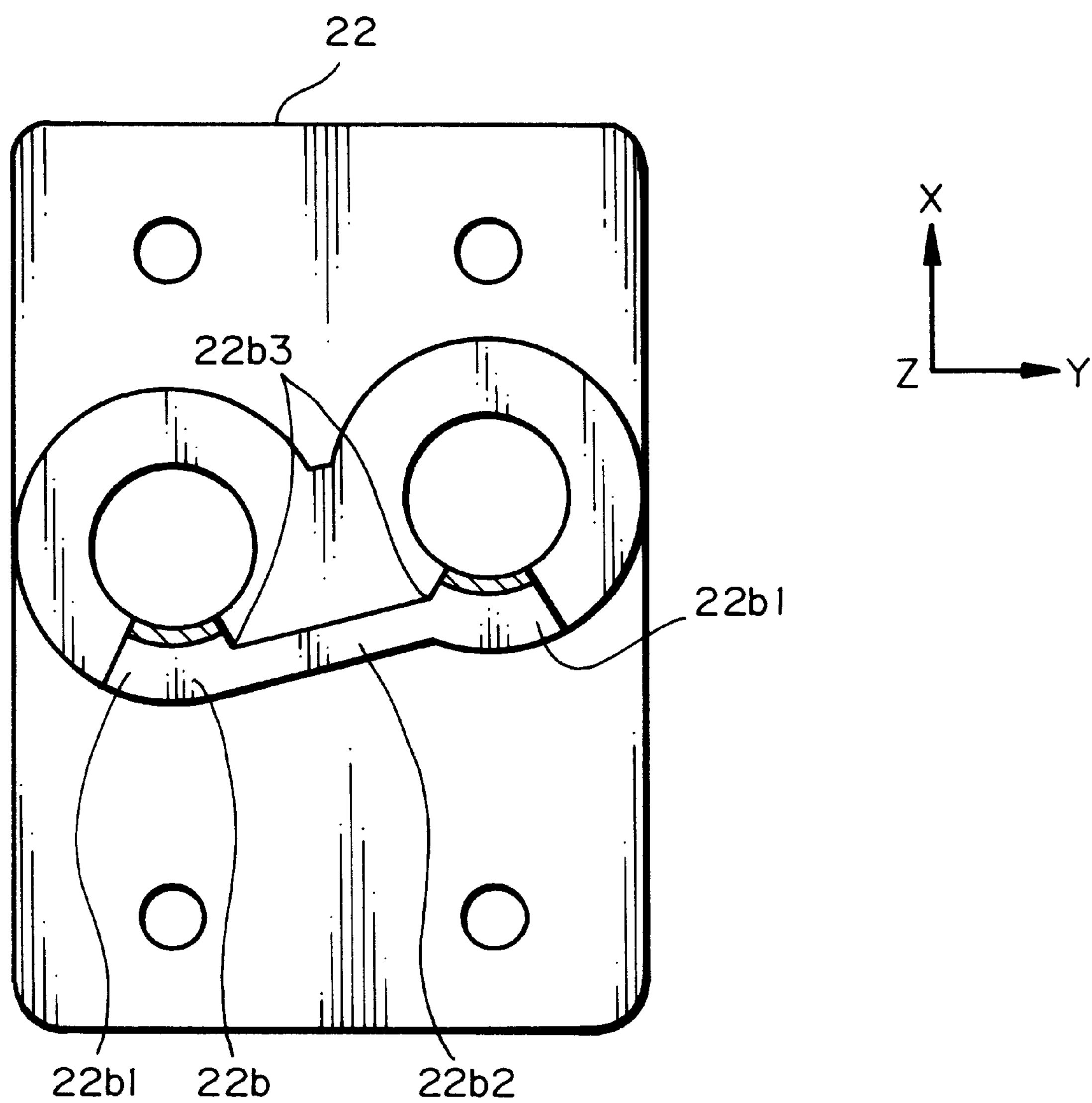
FIG. 10 is a front view showing a modification of the fourth embodiment.

FIG. 10 shows a base 22 representative of a modification of the fourth embodiment. As shown, a line connecting the optical axes of the two collimator lenses 3 is inclined with respect to the y axis. The difference between the base 21, FIGS. 9A and 9B, having the lenses 3 arranged in parallel to the axis y, and the base 22 stems from a difference in the structure of writing optics, although not described specifically. The base 22 includes a lens support portion 22*b* which is also inclined. The lens support portion 22*b* is made up of two lens support portions 22*b*1 and a straight tie portion 22*b*2 connecting them together. The tie portion 22*b*2 is slightly thinner than the tie portion 21*b*2, FIGS. 9A and 9B, and stepped, as illustrated. The tie portion 22*b*2 may be slightly inclined, a shown and described, although it will be most effective when extending in parallel to the y axis.

5th Embodiment

Figure 11:
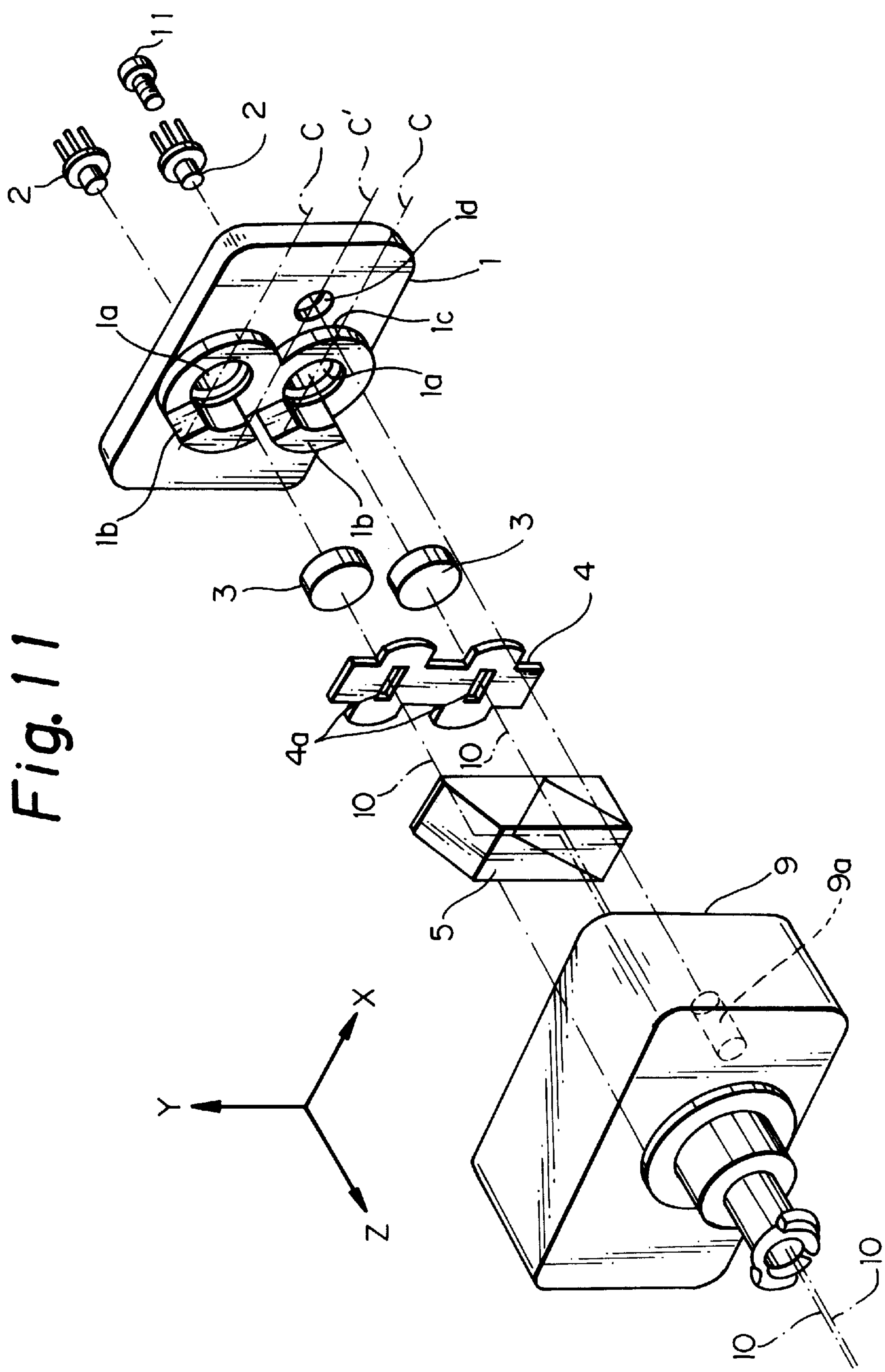
FIG. 11 is an exploded perspective view showing a fifth embodiment of the present invention.

FIG. 11 shows a fifth embodiment of the present invention. This embodiment is essentially similar to the embodiment of FIG. 7; identical structural elements are designated by identical reference numerals and will not be described in order to avoid redundancy. In the conventional structure shown in FIG. 2, the flange 205 is fastened to the case 212 by the screws inserted into the four holes 205*b* formed in the corners of the flange 205. This gives rise to a problem that if the flange 205 and case 212 are different in the coefficient of linear expansion, then the temperature elevation of the light source device distorts the flange 205 and thereby disturbs the distance between the two beams 211 and the parallelism of the same (beam pitch accuracy).

In the illustrative embodiment, a single hole 1*d* is formed in the base 1 in the vicinity of the center of the base 1. A female threaded hole 1*d* is formed in the case 9. A screw 11 is driven into the threaded hole of the case 9 via the hole 1*d* of the base 1, so that the base 1 is fastened to the case 9 at a single point.

In the above configuration, even when the base 1 and case 9 are different in the coefficient of linear expansion, each of them can expand and contrast independently of the other. This frees the base 1 from distortion and insures the accurate beam pitch between the two beams 10. The base 1 and case 9 each can be formed of any desired material and therefore implemented even as an inexpensive plastic molding. Moreover, if the hole 1*d* for the screw 11 is positioned on a center line C' intermediate between the center lines C of the lasers 2 extending in the direction y, it is possible to protect the base 1 from deformation and to enhance the stability of the relative position of the base 1 and case 9 during assembly, i.e., accurate beam pitch.

6th Embodiment

Figure 12:
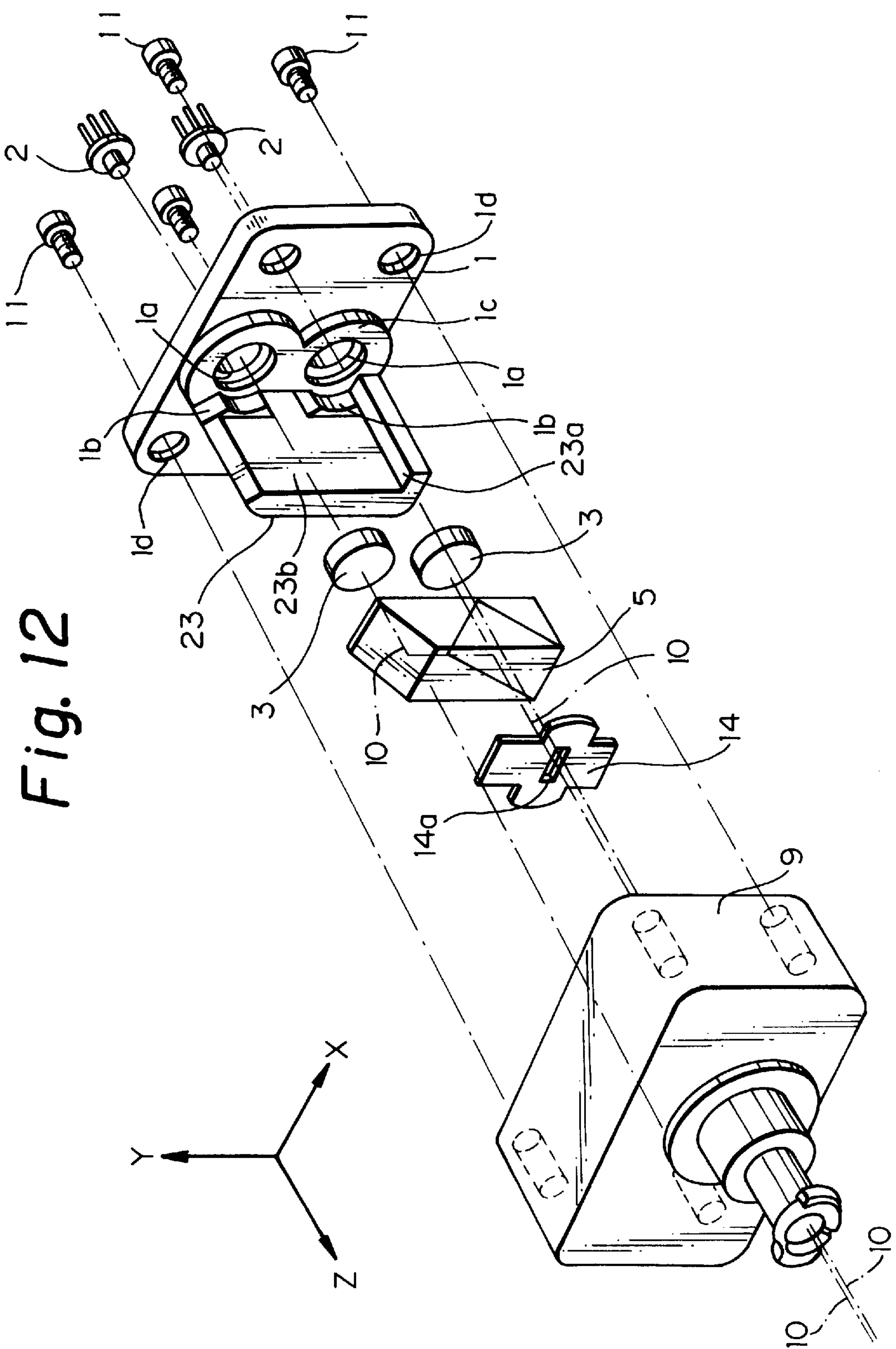
FIG. 12 is an exploded perspective view showing a sixth embodiment of the present invention.
Figure 13:
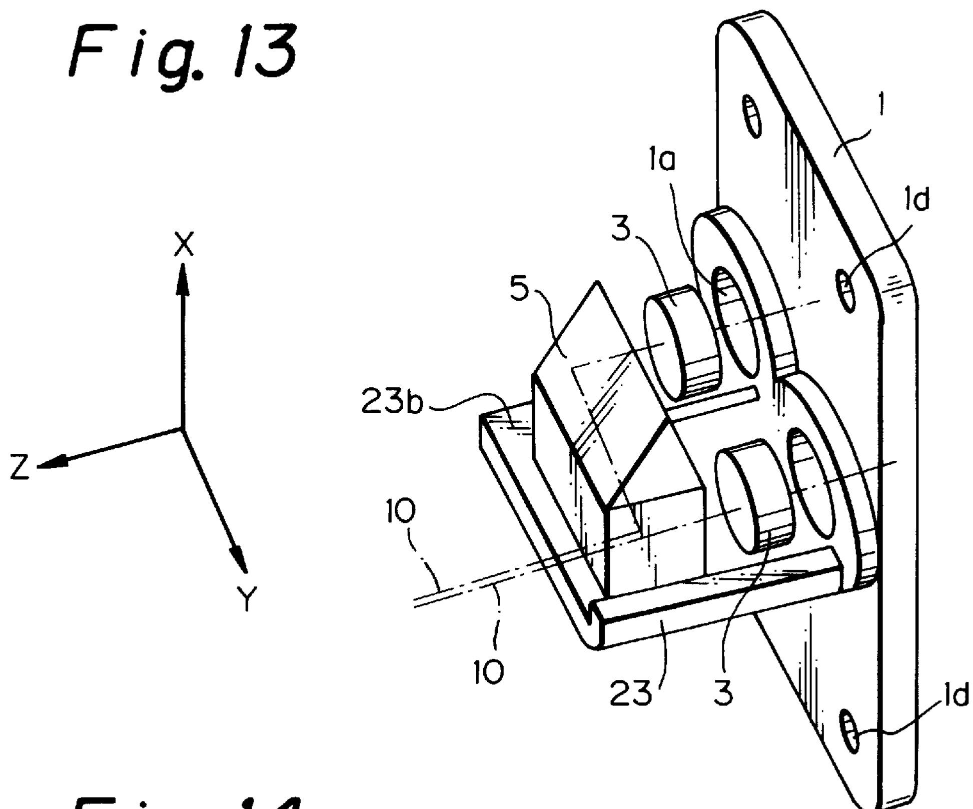
FIG. 13 is a perspective view of the) sixth embodiment.
Figure 14:
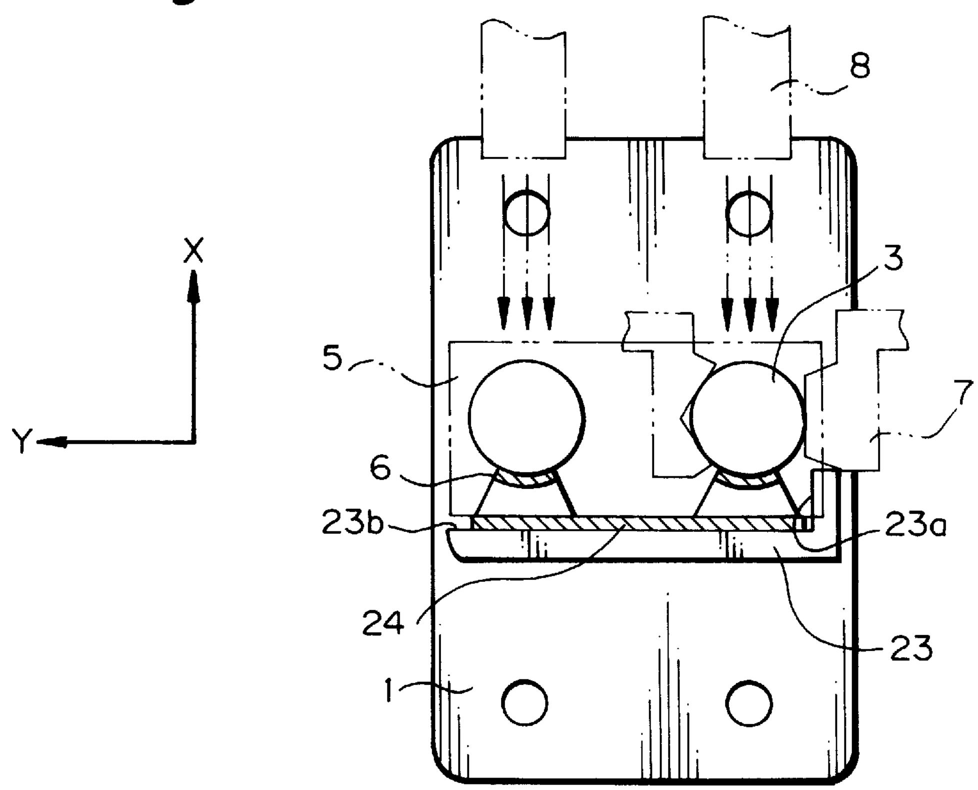
FIG. 14 is a front view of the sixth embodiment.

FIGS. 12–14 show a sixth embodiment of the present invention also constituting an improvement over the conventional light source device of FIG. 2. In the device shown in FIG. 2, the case 212 is mounted to the flange 205 after the optical element 210 has been mounted to the case 212. This is undesirable because any positional error of the optical element 210 effects the pitch accuracy of the beams 211. Moreover, while the case 212 should preferably be implemented as an inexpensive plastic molding, a plastic molding is noticeably susceptible to temperature. Particularly, the displacement of a plastic molding (especially in the beam pitch direction) ascribable to expansion or contraction has critical influence on accuracy. The sixth embodiment is a solution to such problems.

As shown in FIG. 12, the base 1 additionally includes an optical element support portion 23 extending out from the opposite lens support portions 1*b*. An aperture forming member 14 is positioned downstream of the optical element 5 in the direction of beam propagation and therefore formed with a single aperture 14*a*.

The optical element support portion 23 includes a reference surface 23*a* and a surface 23*b*, as illustrated. The optical element 5 is positioned by the reference surface 23*a* and affixed to the surface 23*b* by an adhesive layer 24 (see FIG. 14). In this configuration, even when the adhesive layer 24 expands or contracts due to temperature variation, no changes occur in the direction y (beam pitch direction).. The adhesive should preferably be reliable photo-curable adhesive and should preferably be identical with the adhesive used to affix the collimator lenses 3 from the easy production standpoint. Subsequently, the collimator lenses 3 are positioned and then adhered, as described with reference to FIG. 8.

All of the semiconductor lasers 2, collimator lenses 3 and optical element 5 needing high positional accuracy are supported by the base 1, as stated above. With this configuration, it is easy to implement required assembly accuracy and maintain it. In addition, the optical element support portion 23 extends in the direction y and effectively obviates distortion in the direction y.

While the optical element support portion 23 has been shown and described as being molded integrally with the lens support portions 1*b*, it may be implemented as an independent member and mounted to the base 1.

7th Embodiment

Figure 15:
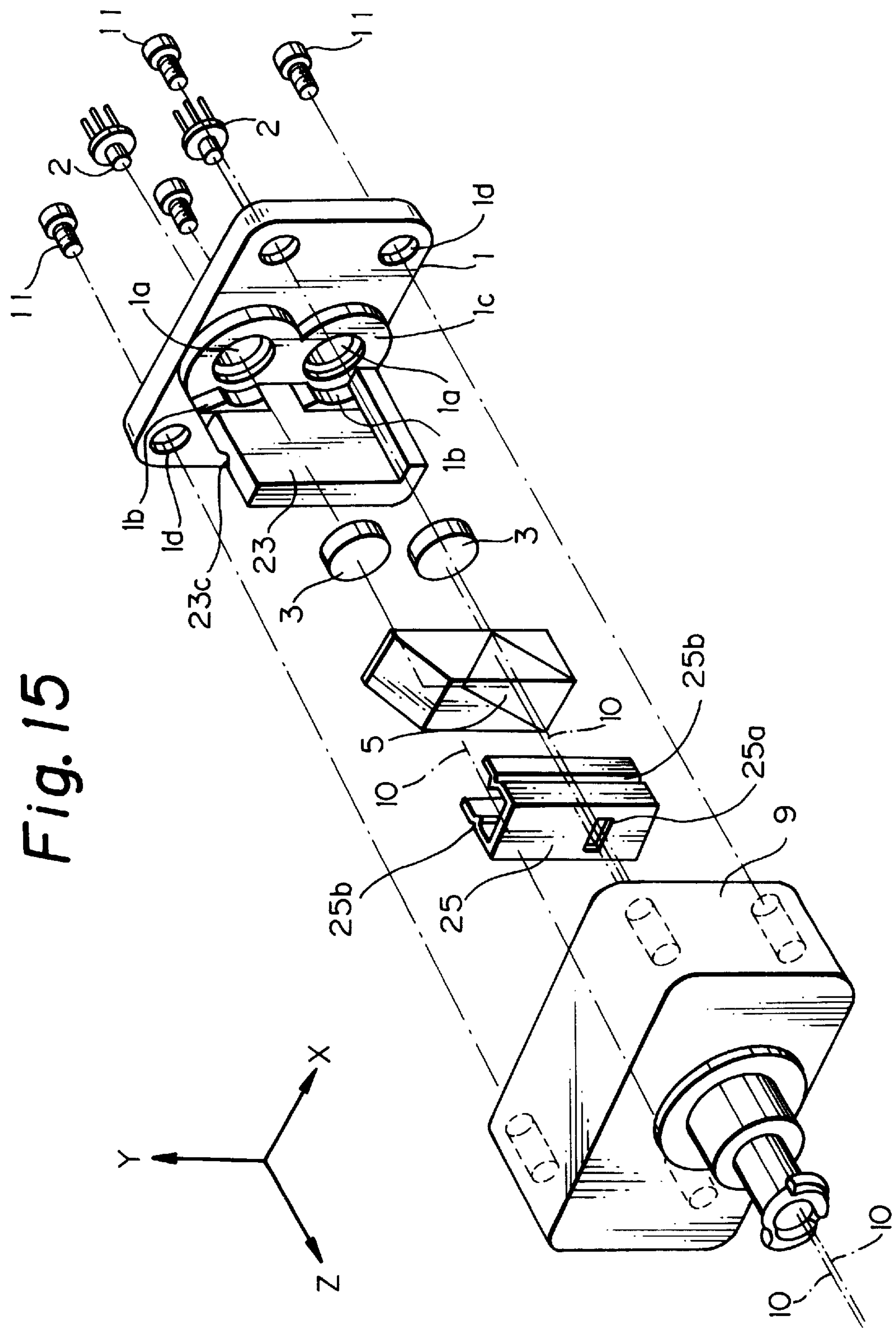
FIG. 15 is an exploded perspective view showing a seventh embodiment of the present invention.
Figure 16:
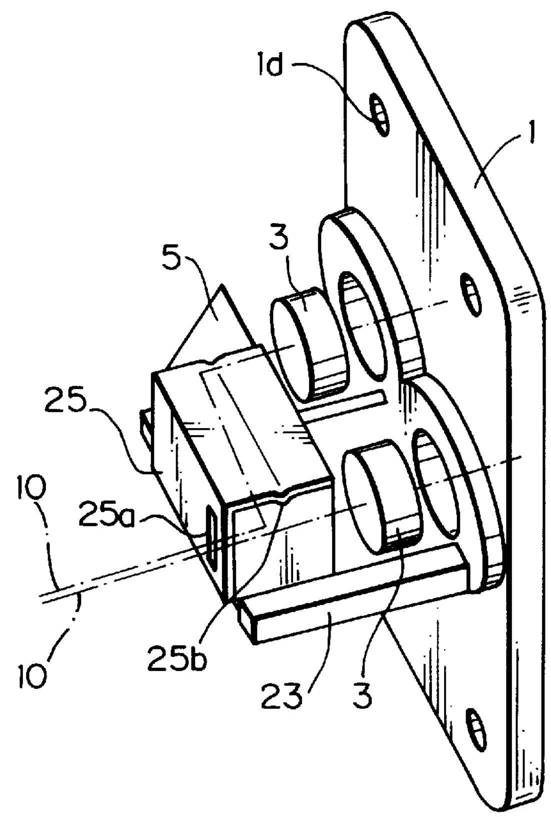
FIG. 16 is a perspective view showing a base included in the seventh embodiment.
Figure 17:
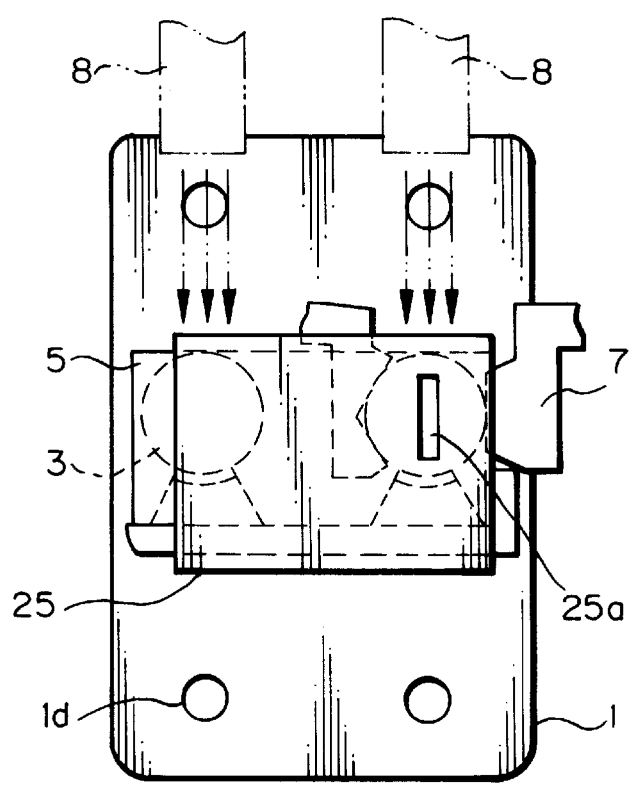
FIG. 17 is a front view of the base of FIG. 16.

Referring to FIGS. 15–17, a seventh embodiment of the present invention will be described. In the conventional light source device shown in FIG. 2, the aperture forming member 209 is mounted to the case 212 and then mounted to the flange 205 together with the case 212. This brings about a problem that any error in the position of the aperture 209*a* translates into an error in the position for emission. Further, the semiconductor lasers 203 are mounted to the base 201 while the lens holders 207 and collimator lenses 3 are affixed to the flange 205. After the adjustment of the optical characteristics, the aperture forming member 209 is mounted. This brings about another problem that a scatter in the pitch of the two apertures 209*a* results in an error in optical characteristic after the mounting of the aperture forming member 209 and thereby lowers the beam pitch accuracy.

In light of the above, the seventh embodiment includes an elastic aperture forming member 25 implemented as, e.g., a plastic molding having a generally U-shaped cross-section. The aperture forming member 25 is mounted to the base 1 in such a manner as to embrace the optical element 5 positioned on the optical element support portion 23. A single aperture 25*a* is formed in the aperture forming member 25 because the member 25 is located downstream of the optical element 5 in the direction of beam propagation. The aperture forming forming member 25 includes opposite walls for retaining the optical element 5, as illustrated. The walls are formed with rib-like projections 25*b* convex toward each other. The optical element support portion 23 is formed with a groove 23*c* capable of mating with one of the projections 25*b*. This configuration prevents the member 25 from easily slipping out of the base 1 and increases the retaining force of the member 25.

In the illustrative embodiment, the aperture forming member 25 is mounted to the base 1 after the adjustment of the optical characteristics of the base 1. This successfully maintains the initially set emission points with accuracy and prevents the member 25 from effecting the beam pitch. Moreover, the member 25 can be easily positioned without resorting to any extra part. In addition, the pitch of the aperture and therefore the beam pitch accuracy is free from the influence of deformation of the case 9, so that the case 9 can be implemented by an inexpensive plastic molding in order to reduce the cost of the light source device.

8th Embodiment

Figure 18:
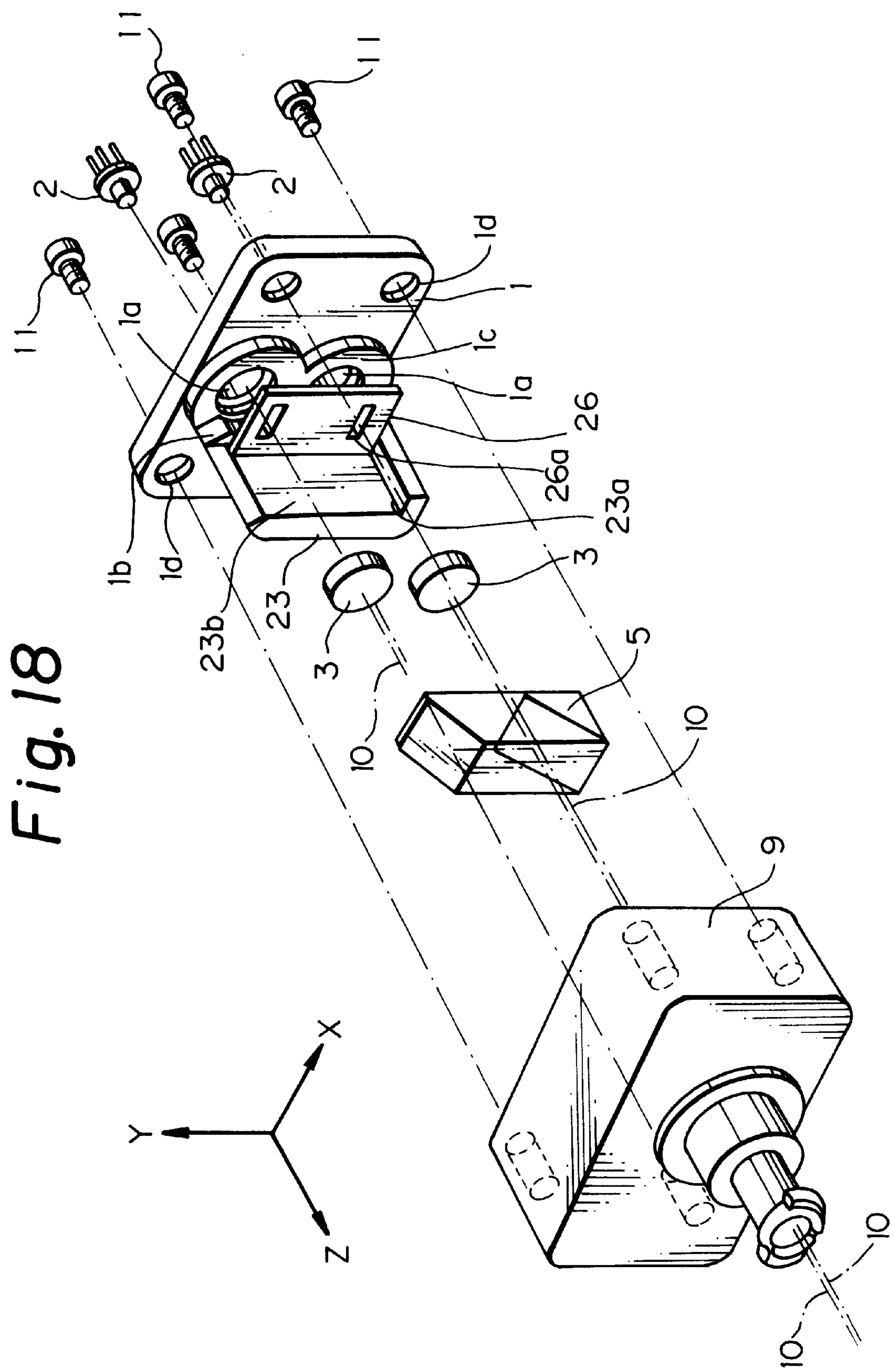
FIG. 18 is an exploded perspective view showing an eighth embodiment of the present invention.
Figure 19:
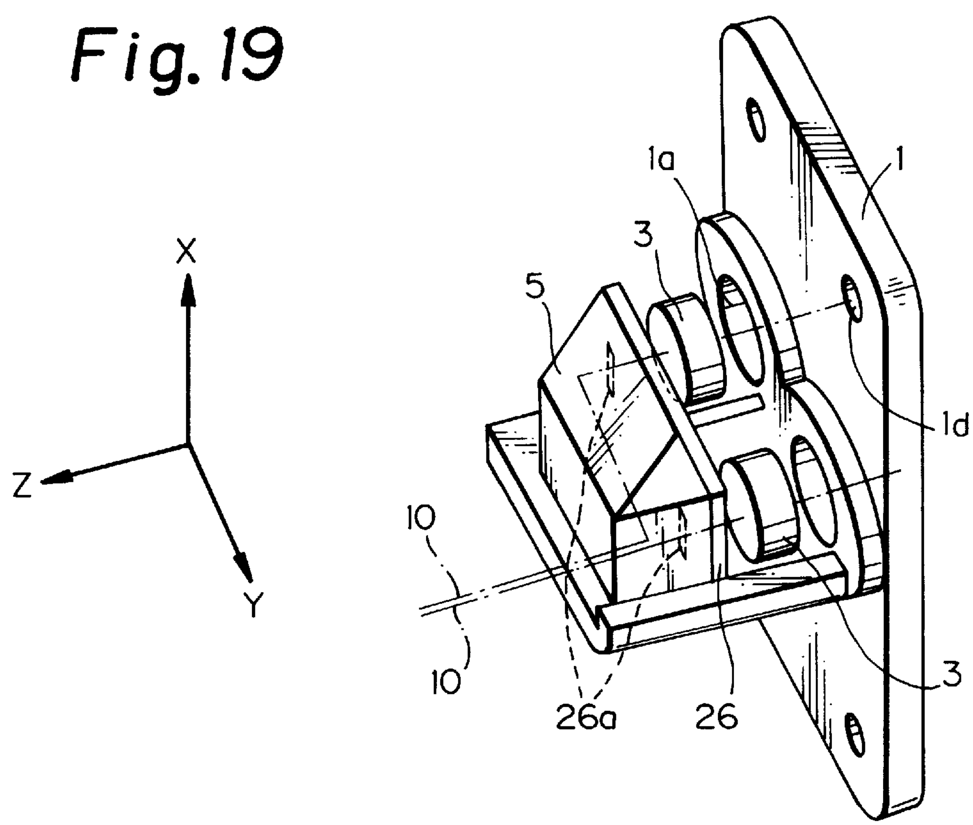
FIG. 19 is a perspective view showing a base included in the eighth embodiment.
Figure 20:
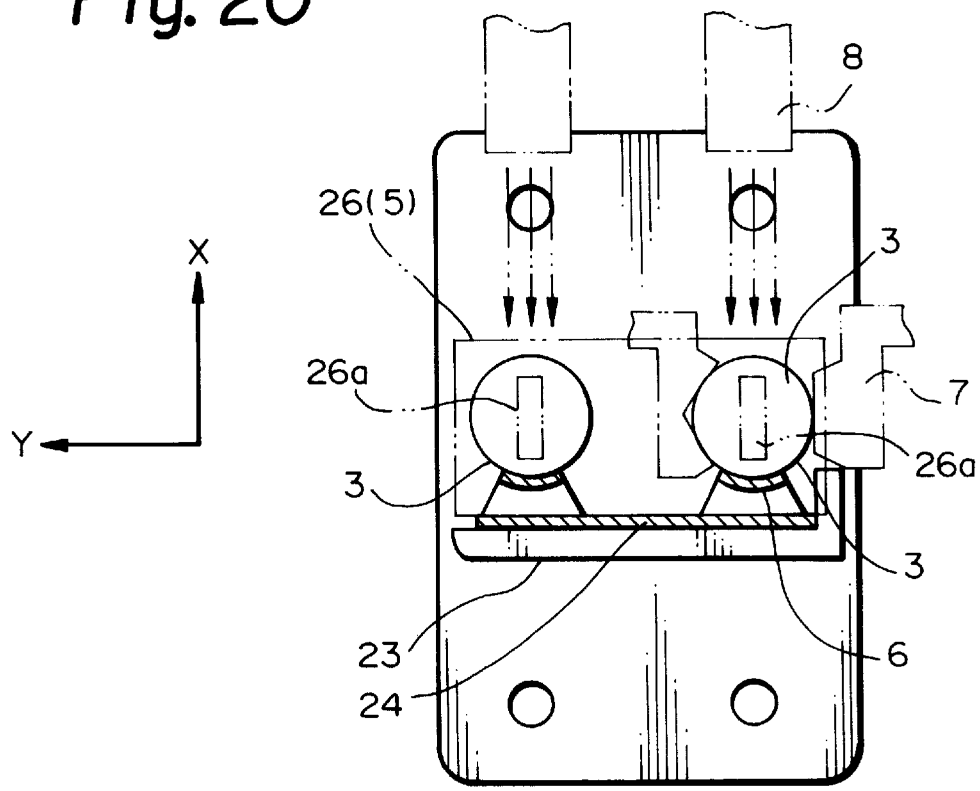
FIG. 20 is a front view of base shown in FIG. 19.

FIGS. 18–20 show an eighth embodiment of the present invention. As shown, an aperture forming member 26 is molded integrally with the optical member support portion 23 of the base 1. Two apertures 26*a* are formed in the aperture forming member 26 such that they respectively align with the centers of the collimator lenses 3. If desired, the aperture forming member 26 may be implemented as an independent member and affixed to the optical support portion 23 by, e.g., adhesive.

The aperture forming member 26 is constructed integrally with the base 1 and allows the optical characteristics to be adjusted on the basis of the beams passed through and shaped by the apertures 26*a*. This guarantees the optical characteristics while absorbing errors in the accuracy and positions of the apertures 26*a,* thereby providing the light source device with high accuracy. Furthermore, the aperture forming member 26 formed integrally with the base 1 reduces the number of parts, and in addition the case 9 can be implemented by an inexpensive plastic molding. The resulting light source device is low cost.

9th Embodiment

Figure 21:
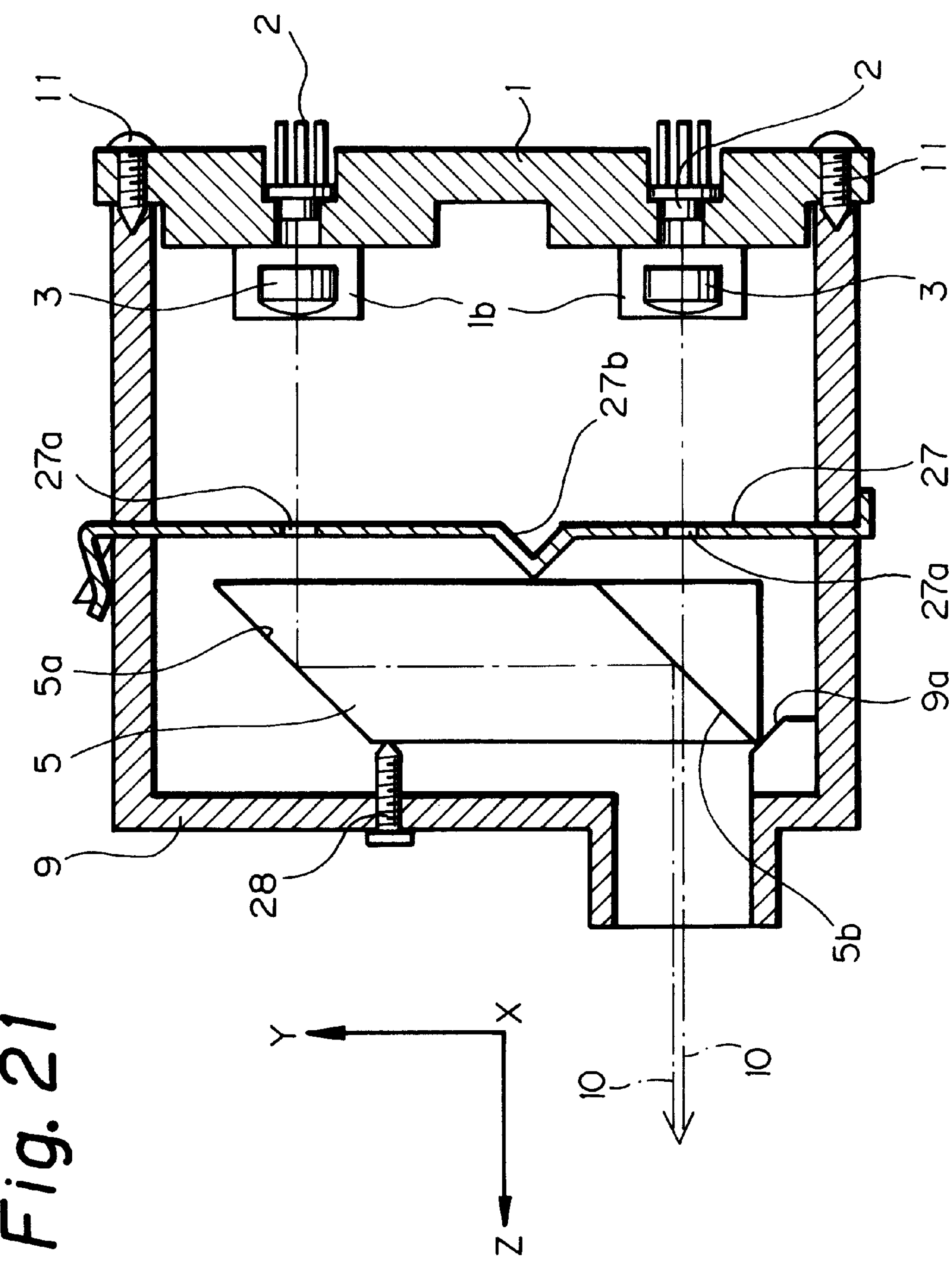
FIG. 21 is a vertical section showing a ninth embodiment of the present invention.
Figure 22:
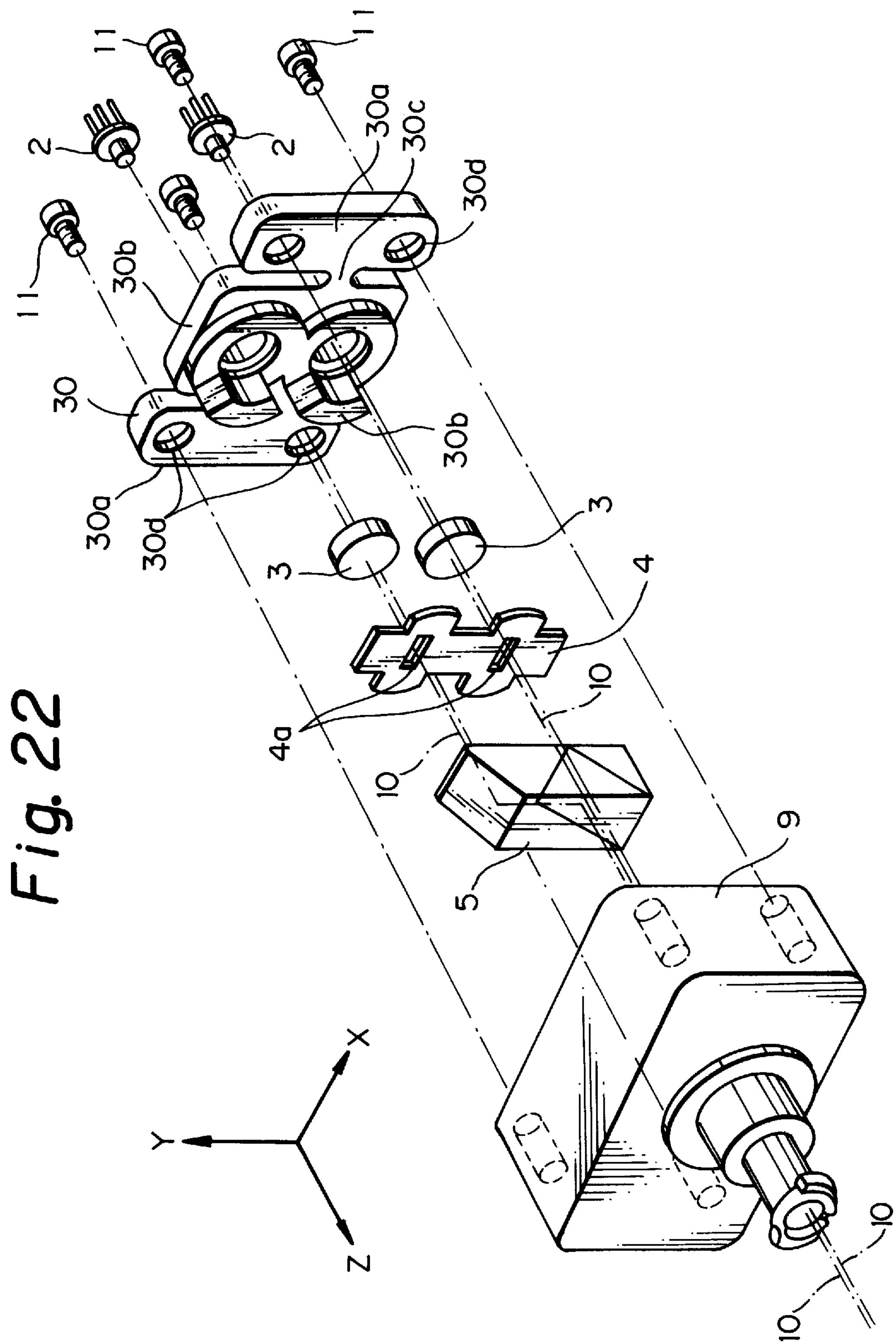
FIG. 22 is an exploded perspective view showing a tenth embodiment of the present invention.
Figure 23:
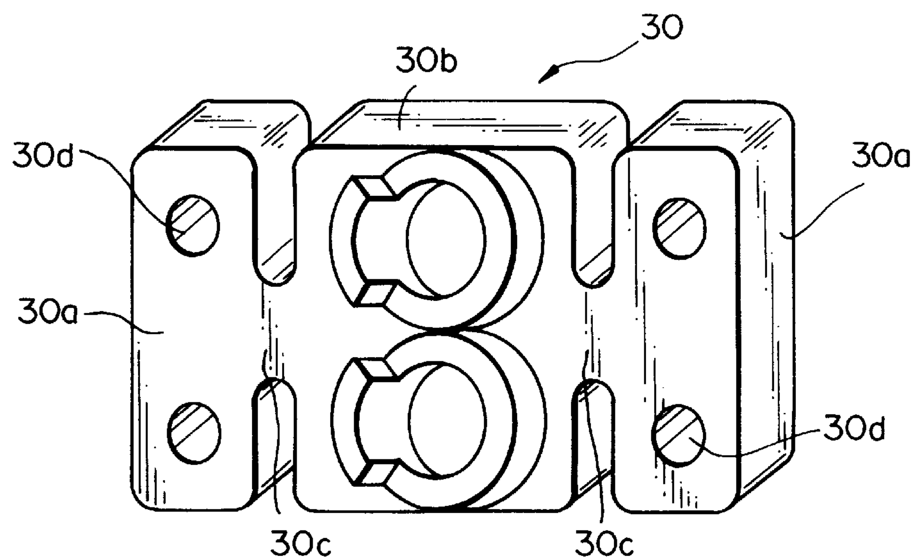
FIG. 23 is a perspective view of a base included in the tenth embodiment.

FIG. 21 shows a ninth embodiment of the present invention. As for optical characteristics, a light source device is required to have the directionality (optical axis characteristic) and parallelism (collimation characteristic) of a laser beam to issue therefrom, as stated earlier. In practice, however, even if a collimator lens is brought to a desired position, it is displaced due to, e.g., the contraction of adhesive ascribable to curing and deformation ascribable to fastening. As a result, the optical characteristic after adhesion is extremely unstable. This embodiment solves this problem.

As shown in FIG. 21, the base 1 is fitted in the right end of the case 9. The semiconductor lasers 2 and collimator lenses 3 are affixed to the base 1. An aperture forming member 27 is formed with two apertures 27*a* and implemented as a thin elastic plate. A lug 27*b* is positioned at the center of the aperture forming member 27. A seat 9*a* is formed integrally with the case 9 and supports the bottom left edge of the optical element or prism 5, as viewed in FIG. 21. The lug 27*b* of the aperture forming member 27 elastically supports the intermediate portion of the right end of the element 5. A screw or adjusting means 28 extends throughout the wall of the case 9 and supports the top left portion of the element 5. The seat 9*a* is a stationary fulcrum defining the center of rotation. The adjusting means 28 should only be capable of finely adjusting the angular position of the element 5 and is therefore not limited to a screw.

Because the seat 9*a* of the case 9 is flat, it is held in line-to-line contact with the optical element 5. The element 5 is therefore angularly movable about the seat 9*a* in a y-z plane (or about the x axis).

When the screw 28 is turned, its length within the case 9 varies and causes the optical element 5 contacting the seat 9*a* to rotate over a small angle in the y-z plane. As a result, the distance between a first reflection surface 5*a* and a second reflection surface 5*b* included in the element 5 in the direction y is varied to, in turn, vary the distance between the two beams 10 (pitch in the subscanning direction) in the direction y.

The angular movement of the optical element 5 varies only the distance between the beams 10 in the direction y, i.e., it does not effect the accuracy in the direction x or the parallelism of each beam 10. That is, the rotation mechanism is capable of adjusting only the beam pitch without effecting the other optical factors. This is also true with three or more beams.

The screw constituting the adjusting means 28 may be replaced with a screw extending through the lug 27*b,* in which case the aperture forming member 27 will be formed of a material deformable little. To turn the screw positioned at the lug 27*b,* the base 1 may be formed with a hole for allowing a driver to be inserted toward the screw therethrough.

10th Embodiment

FIGS. 22–25 show a tenth embodiment of the present invention. In the conventional light source device discussed with reference to FIG. 2, the flange 205 and case 211 formed of metal and resin, respectively, are fastened together by the four screws 204. As a result, when the temperature of the device rises, the flange 205 is caused to bend due to a difference in the coefficient of linear expansion between the two materials. Particularly, a bend in the beam pitch direction or direction y disturbs the parallelism of the individual beam; even the slightest error in parallelism is critical because of the enlargement type optics.

Further, stresses in the directions x and y which are causative of the above deformation are noticeably different in size and cause the flange 205 to deform in combination. As a result, the flange 205 deforms in a more complicate manner. This, coupled with the fact that the deformation of the flange 205 depends on the rigidity of the same, causes the beam pitch to vary in a complicate manner and results in defective images. This embodiment solves this problem.

As shown in FIGS. 22–25, a base 30 is made up of opposite mount portions 30*a,* an intermediate light source portion 30, and narrow bridge portions 30*c* respectively bridging the mount portions 30*a* and light source portion 30*b*. The semiconductor lasers 2 and collimator lenses 3 are affixed to the light source portion 30. The base 30 is therefore identical with the base 1 of FIG. 7 except for the narrow bridge portions 30*c.* As for the rest of the construction, too, this embodiment is identical with the embodiment of FIG. 7.

Each bridge portion 30*c* is positioned at the intermediate between an upper and a lower screw hole 30 formed in the adjoining mount portion 30*a,* and is coincident with the x axis direction. The bridge portions 30*c* are shown as being as thick as the mount portions 30*a* and light source portion 30*b,* but they may be thinner than them, if desired. In the illustrative embodiment, each mount portion 30*a* is symmetrical in the up-and-down direction. Even when the mount portion 30*a* is not symmetrical in the above direction, the bridge portion 30*c* should preferably be positioned at the intermediate between the upper and lower screw holes 30*d.*

Figure 24:
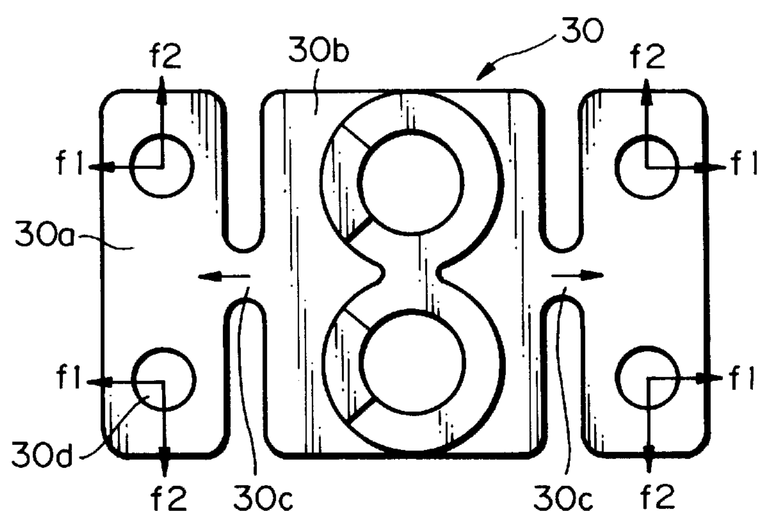
FIG. 24 is a front view of the base of the tenth embodiment.
Figure 25:
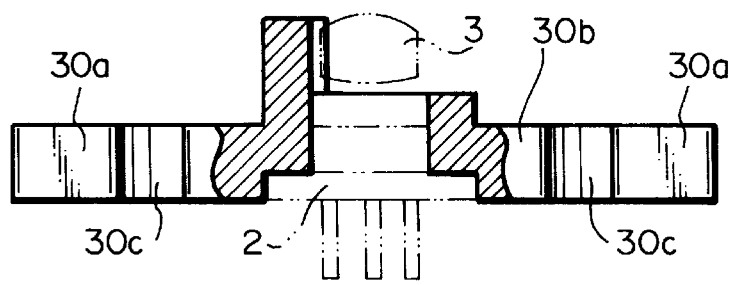
FIG. 25 is a partly taken away bottom view of the base included in the tenth embodiment.

Assume that the case 9 has a greater coefficient of linear expansion than the base 30. Then, as shown in FIG. 24, an increase in ambient temperature causes forces f1 and f2 to act on the front of the base 30 in such a manner as to extend it in the directions x and y, respectively. However, only pulling forces f3 act on the light source portion 30*b* via the bridge portions 30*c*. Therefore, the base 30 is free from the complicate bend stated earlier although its bridge portions 30*c* deform. Consequently, the bend of the light source portion 30*b* does no occur or occurs little in the directions x and y. Particularly, deformation in the direction y having noticeable influence on the beam pitch is substantially obviated, so that the accurate beam pitch is maintained.

While the illustrative embodiment includes two bridge portions 30*c*, it may include only one of them or three or more bridge portions in consideration of limitations on the device or in matching relation to an application.

11th Embodiment

Figure 26:
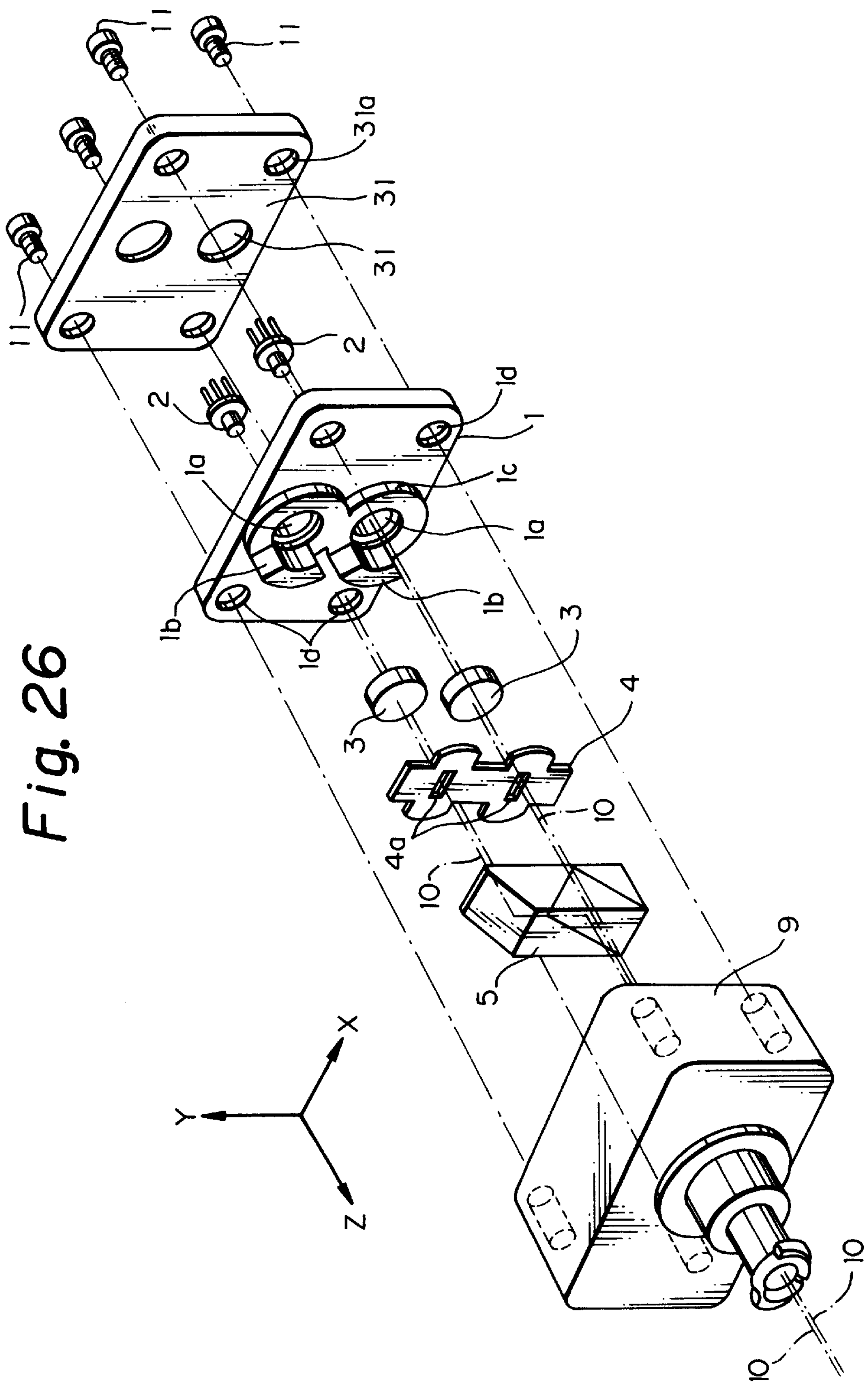
FIG. 26 is an exploded perspective view showing an eleventh embodiment of the present invention.

An eleventh embodiment of the present invention will be described with reference to FIG. 26. The base 1 and case 9 formed of aluminum and resin, respectively, are different in the coefficient of linear expansion, as stated previously. This, coupled with the fact that the base 1 and case 9 are fastened by the screws 11 at their four corners, causes the base 1 to bend when the ambient temperature rises. As a result, the beam pitch is disturbed and brings about defective images.

In light of the above, this embodiment includes a back plate 31 positioned at the side opposite to the case 9 with respect to the base 1. The back plate 31 is formed of a material having substantially the same coefficient of linear expansion as the material of the case 9, e.g, of the same material as the case 9. The back plate 31 is a rectangular plate having the same size as the base 1. Holes 31*a* for the screws 11 are formed in the four corners of the back plate 31 while two holes 31*b* for the semiconductor lasers 2 are formed at the center of the back plate 31.

The base 1 is sandwiched between the case 9 and the back plate 31 substantially identical in size in the directions x and y and fastened to them by the screws 11. When temperature around the light source device rises, the case 9 and back plate 31 having the same coefficient of linear expansion expand in exactly the same manner as each other. The deformations occurring at both sides of the base 1 cancel each other and cancel the deformation of the base 1 and prevent the base 1 from bending. This protects the beam pitch from disturbance.

If the case 9 and back plate 31 are noticeably different in bending rigidity, then the base 1 may be caused to bend. In case of this kind of bend, the bending rigidity of the back plate 31 should preferably be substantially the same as the bending rigidity of the case 9.

12th Embodiment

Figure 27:
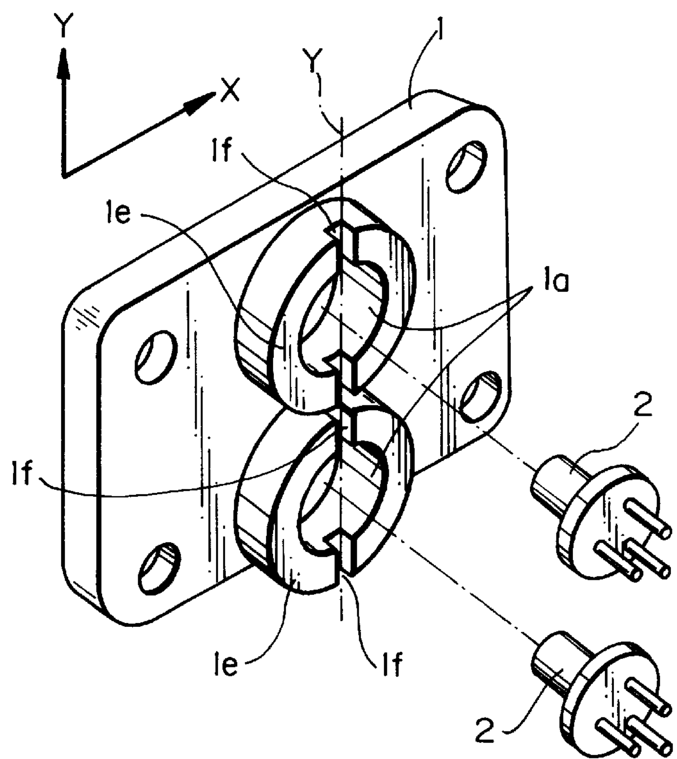
FIG. 27 is a perspective view showing a twelfth embodiment of the present invention.
Figure 28A:
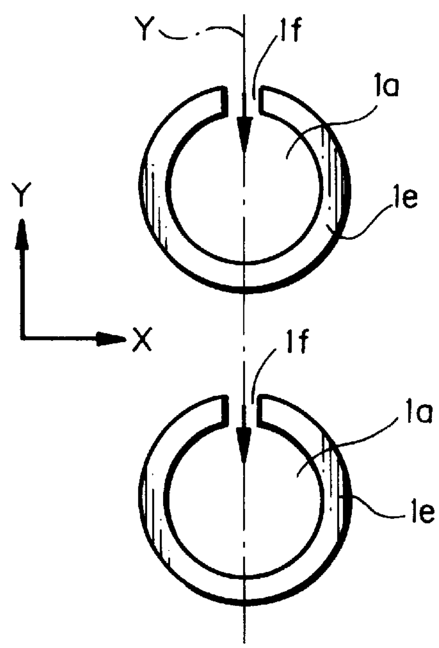
FIGS. 28A and 28B each shows a specific arrangement of notches formed in a base included in the twelfth embodiment.
Figure 28B:
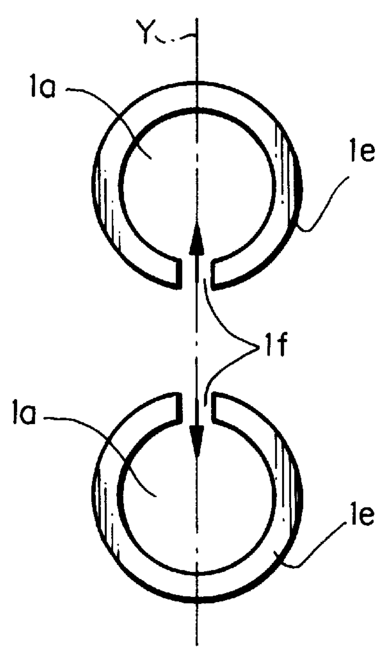
Figure 29:
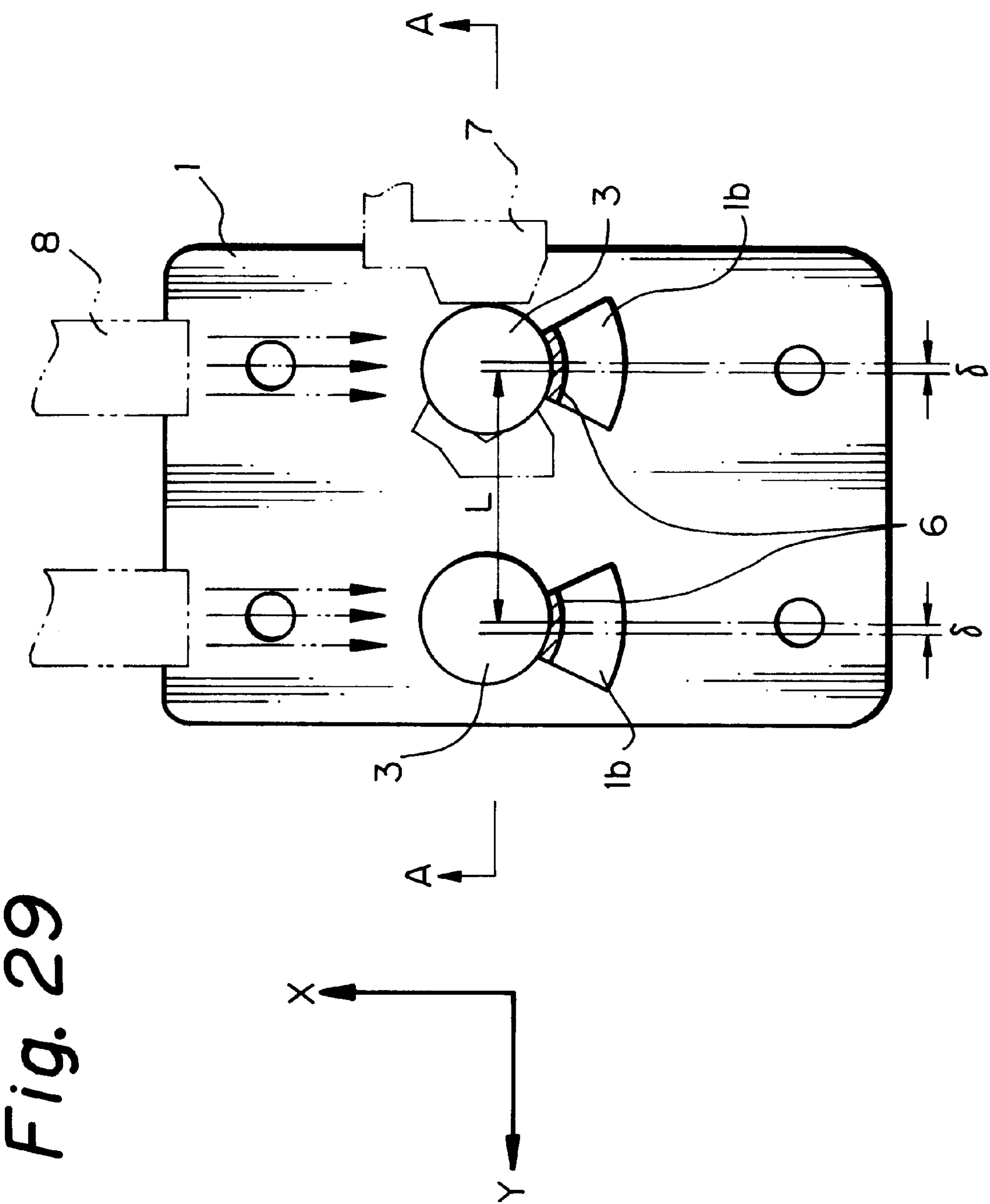
FIG. 29 is a front view showing a thirteenth embodiment of the present invention.
Figure 30:
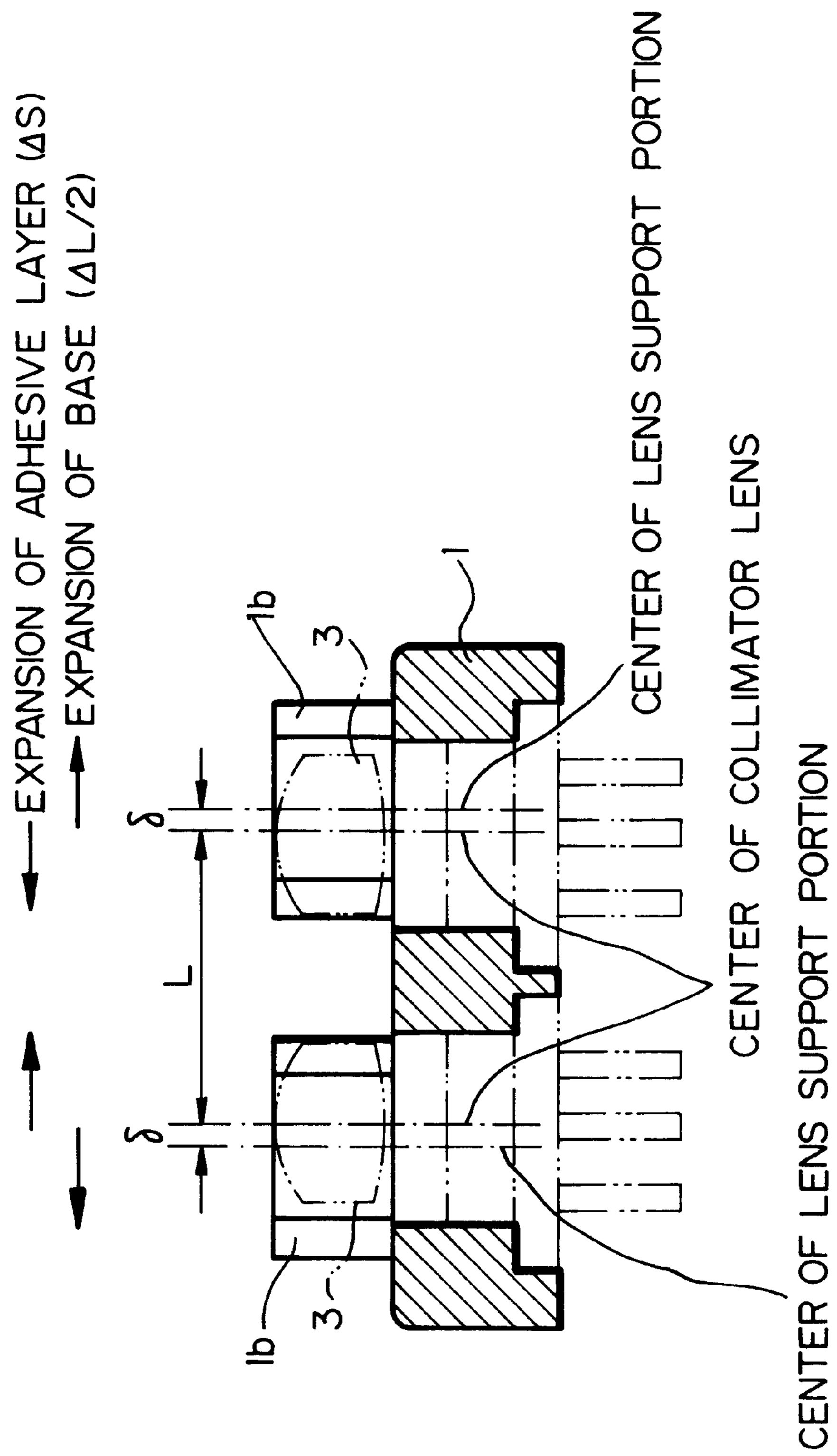
FIG. 30 is a section along line A—A of FIG. 29.

Reference will be made to FIGS. 27, 28A and 28B for describing a twelfth embodiment of the present invention. FIG. 27 shows the configuration the rear of the base 1. As shown, the two through bores la are formed in the center of the base 1. Annular ribs 1*e* each surrounds the respective bore 1*a* on the rear of the base 1 for receiving the metallic flange of the semiconductor laser 2. In FIG. 28, two notches If are formed in each rib 1*e* on a line Y extending in the beam pitch direction (direction y) through the centers of the ribs 1*e*.

The annular ribs 1*e* have an inside diameter slightly smaller than the outside diameter of the lasers 2. Each laser 2 is press-fitted in the respective bore 1*a* while causing the notches 1*f* to spread. Thereafter, the notches 1*f* tend to restore their original positions and thereby increase the retaining force acting on the laser 2. This insures the accurate position of the laser 2.

The above configuration is satisfactory so long as each notch 1*f* spreads evenly in the right-and-left direction due to the insertion of the laser 2. However, the spread of the notch If is not always even in the right-and-left direction. If the spread is not even in the above direction, then the center of the notch If in the widthwise direction shifts and displaces the laser 2. In addition, the displacement is not constant and cannot be estimated. The displacement in the direction y would result in an error in beam pitch and therefore defective images. On the other hand, the displacement in the direction x does not bring about any defective image only if the read timing is corrected. It is therefore desirable to limit the displacement to the direction x.

In the illustrative embodiment, as shown in FIG. 27, the two notches 1*f* are formed in each rib 1*e* face to face on the line Y extending in the beam pitch direction (direction y) through the center of the rib 1*e*. This configuration successfully limits the displacement to the direction x and thereby obviates the influence on the beam pitch ascribable to the displacement in the direction y.

FIGS. 28A and 28B each shows an alternative case in which a single notch 1*f* is formed in each rib 1*e*. In this case, the spread of the notch If causes the rib 1*e* to deform mainly in the direction opposite to the notch 1*f* and perpendicular to the widthwise direction of the notch 1*f*, as indicated by an arrow. In light of this, as shown in FIG. 28A, the notches 1*f* should preferably be positioned only on one side (top) of the ribs 1*e* on the line Y extending through the centers of the ribs 1*e*. Of course, the notches 1*f* may be positioned only at the other side (bottom) of the ribs 1*e* on the line Y. In this configuration, shifts in the direction y occur in the same direction in the upper and lower ribs 1*e* and cancel each other, reducing the displacement in the direction y.

Alternatively, as shown in FIG. 28B, one notch 1*f* may be positioned at the bottom of the upper rib 1*e* while the other notch 1*f* may be positioned at the top of the lower rib 1*e*.

This, however, causes displacements in the y direction to occur in opposite directions. Such displacements would be added up and effect the beam pitch.

The notches 1*f* of the ribs 1*e* are capable of spreading without regard to the beam pitch direction. Therefore, the accuracy of the lasers 2 in the beam pitch direction can be maintained.

13th Embodiment

FIGS. 29, 30 and 31A–31C show a thirteenth embodiment of the present invention also including the lens support portions 1*b* each having an arcuate contact surface. The collimator lenses 3 each is affixed to the arcuate adhesion surface of the associated lens support portion 1*b* by the UV-curable adhesive layer 6, as described with reference to FIG. 8. However, the problem is that the coefficient of linear expansion of the adhesive layer 6 is far greater than the coefficient of linear expansion of the base 1 after the curing of the layer 6.

Figure 31A:
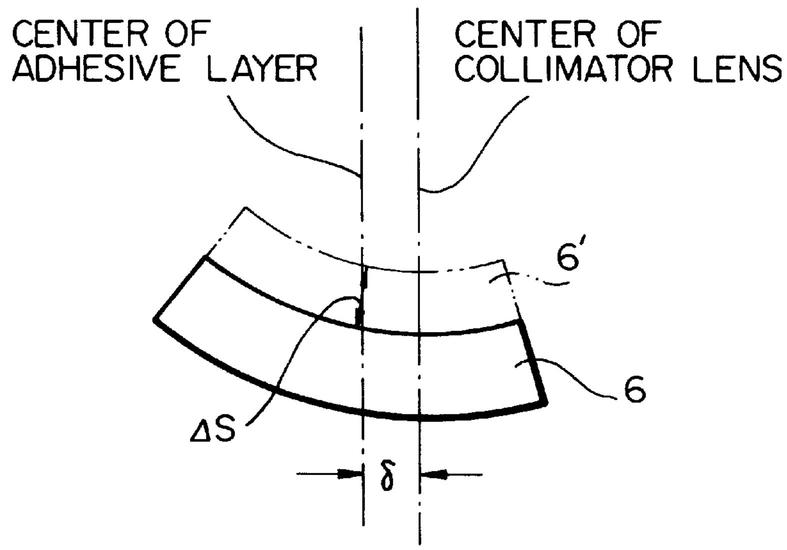
FIG. 31A is an enlarged front view showing an adhesive layer included in the thirteenth embodiment.
Figure 31B:
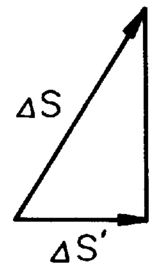
FIG. 31B shows directions in which the adhesive layer of FIG. 31A expands.

On the other hand, as shown in FIGS. 30 and 31A–31C, when the temperature of the base 1 rises, the base 1 expands and increases the distance L between the collimator lenses 3 by $\Delta L/2$ outward of the base 1. The adhesive layer 6 also expands, as indicated by a phantom line 6' in FIG. 31A. However, because the outward expansion of the adhesive layer 6 is limited by the lens support portion 1*b*, the layer 6 expands toward the center of the collimator lens 3. Stated another way, the thickness of the adhesive layer 6 increases inward by ΔS. At this instant, if the center of the adhesive layer 6 is deviated from the center of the collimator lens 3 by δ, as shown in FIG. 31A, then the increment ΔS of the thickness of the layer 6 due to expansion includes a component ΔS' directed toward the center of the base 1, as shown in FIG. 31B. That is, the adhesive layer 6 expands inward in the beam pitch direction.

Figure 31C:
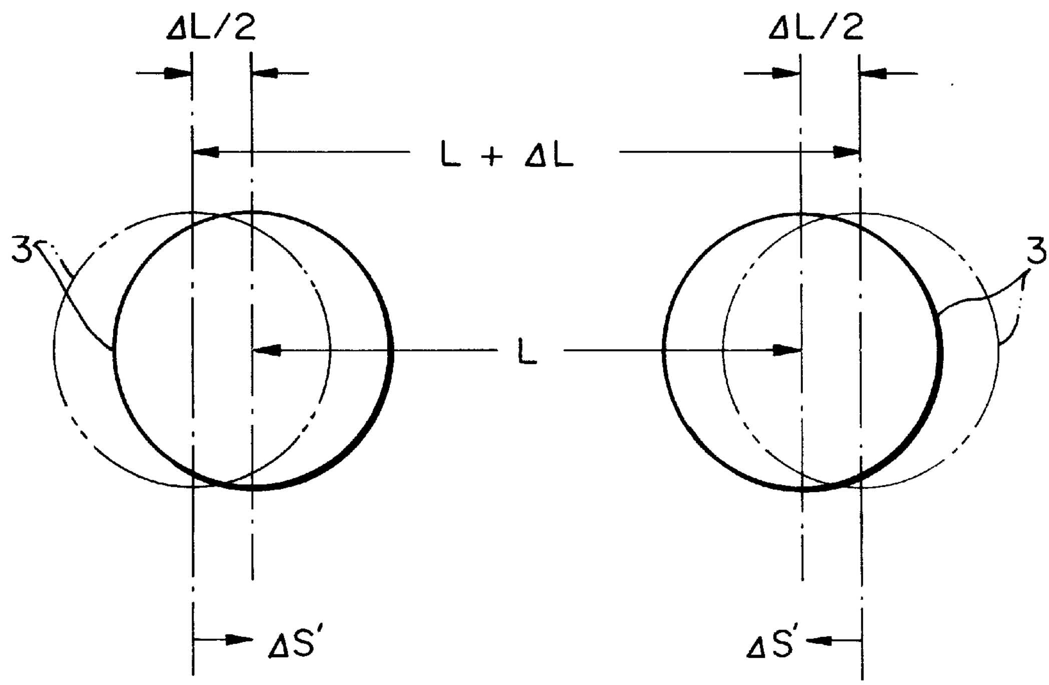
FIG. 31C demonstrates a condition wherein the expansion of the base and that of the adhesive layer cancel each other and appear in the distance between collimator lenses.

In FIG. 31C, the direction in which the distance L between the collimator lenses 3 increases by ΔL (ΔL at each side) and the direction in which each lens 3 is displaced by ΔS' in the direction y are opposite to each other or cancel each other. Specifically, if the center of each adhesive layer 6 is shifted outward of the base 1 by a suitable amount (e.g. δ), then the distance L between the collimator lenses 3 is equal to a value produced by subtracting the expansion component ΔS' of the adhesive layer 6 in the direction y from the original expansion (ΔL/2). It is therefore possible to compensate for the expansion ascribable to temperature elevation and thereby confine the beam pitch accuracy in a required range or fully prevent it from varying.

14th Embodiment

Figure 32:
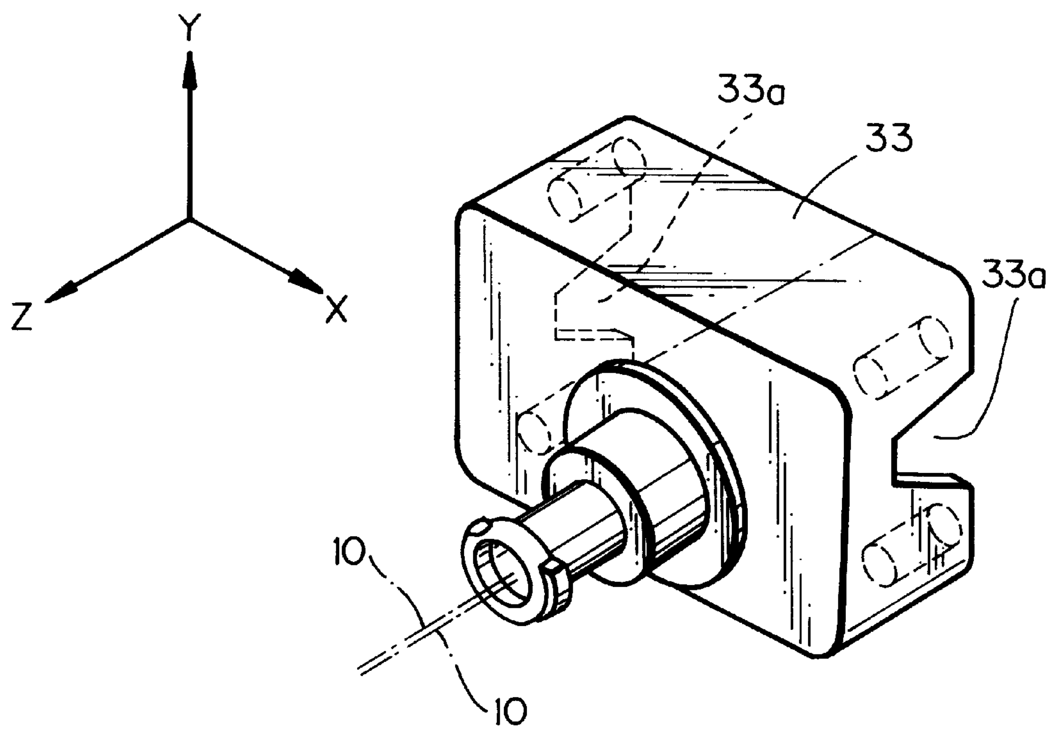
FIG. 32 is a perspective view of a case representative of a fourteenth embodiment of the present invention.
Figure 33:
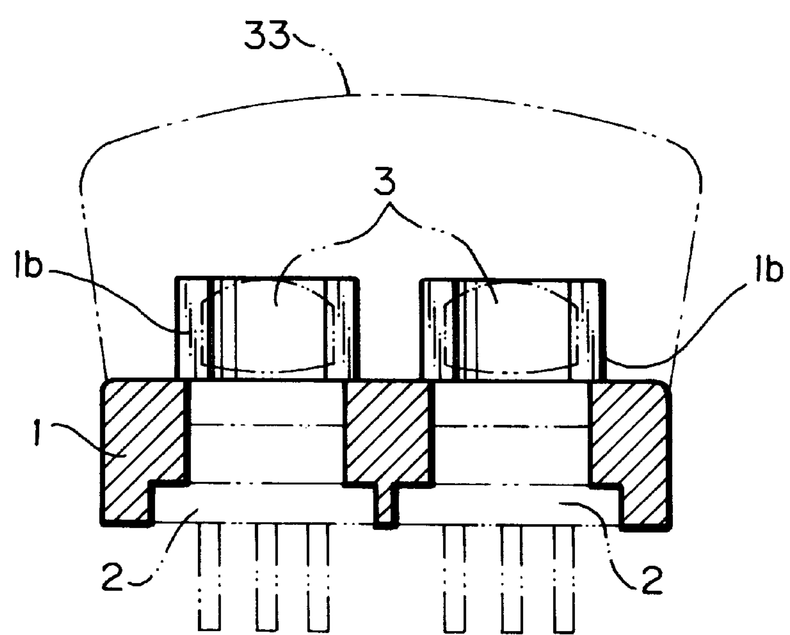
FIG. 33 is a horizontal section showing a base also included in the fourteenth embodiment.

FIGS. 32 and 33 show a fourteenth embodiment of the present invention. Assume that the base 1 and case 9 are respectively formed of aluminum and resin, as stated with reference to FIG. 2. Then, when the light source is subjected to high temperature, the case 9 expands noticeably due to a difference in the coefficient of linear expansion and causes the base 1 to deform. This disturbs the beam pitch and thereby renders images defective.

In the illustrative embodiment, a case 33 is formed with slits 33*a* at both sides thereof. The slits 33*a* reduce the bending rigidity of the case 33. As a result, as shown in FIG. 33, even when the case 33 deforms due to expansion, the deformation does not cause the base 1 to deform. Particularly, when the slits 33*a* are formed in both sides of the case 33 extending in the beam pitch direction, a bend in the direction y can be effectively obviated. The embodiment therefore protects the beam pitch from disturbance and thereby obviates defective images.

15th Embodiment

Figure 34A:
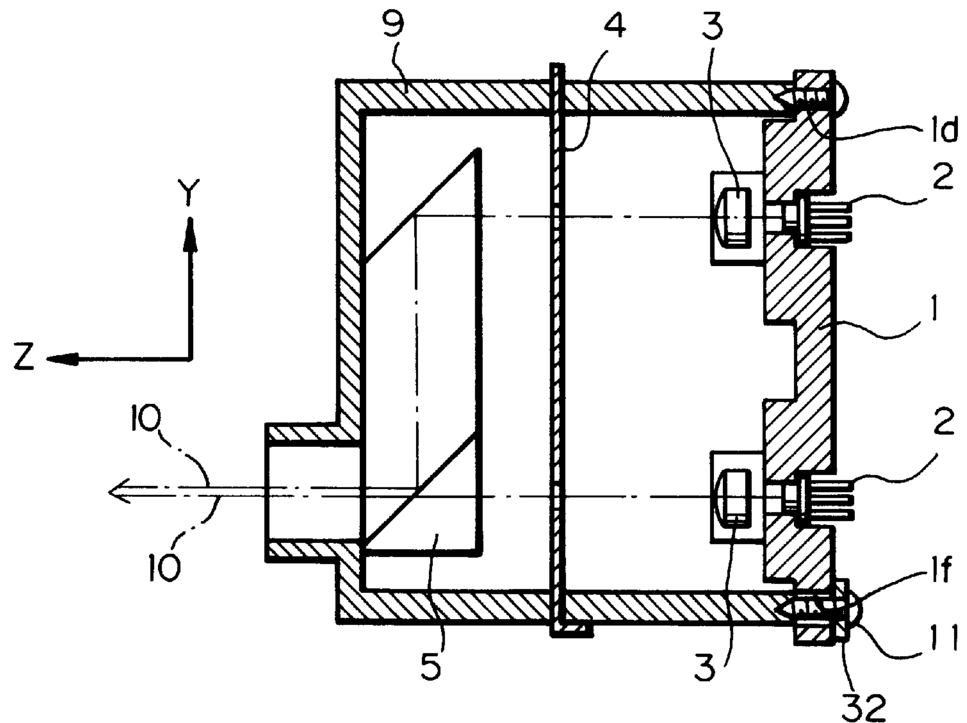
FIG. 34A is a section showing a fifteenth embodiment of the present invention.

FIGS. 34A and 24B show a fifteenth embodiment of the present invention. The flange 205 and case 212 are fastened to each other by the four screws, as stated with reference to FIG. 2. This brings about a problem that the thermal stress of the case 212 is transferred to the flange 205 and causes the flange 205 to bend. This embodiment is a solution to this problem.

As shown in FIG. 34A, in the illustrative embodiment, three of the four holes Id assigned to the screws 11 are implemented as elongate slots 1*f*. An elastic member 32 formed of, e.g., rubber is held between each portion of the base 1 surrounding one slot 1*f* and the screw 11 inserted in the slot 1*f* so as to obviate shaking.

In the above configuration, the case 9 and base 1 are affixed to each other at a single point and movable in the x-y plane within the range of the clearances between the other screws 11 and the slots 1*f*. It follows that even when the case 9 expands due to temperature elevation, the base 1 is prevented from bending so long as the clearances are available between the screws 11 and the slots 1*f*. If desired, the slots 1*f* may be replaced with circular bores greater in diameter than the bore 1*d*.

Figure 34B:
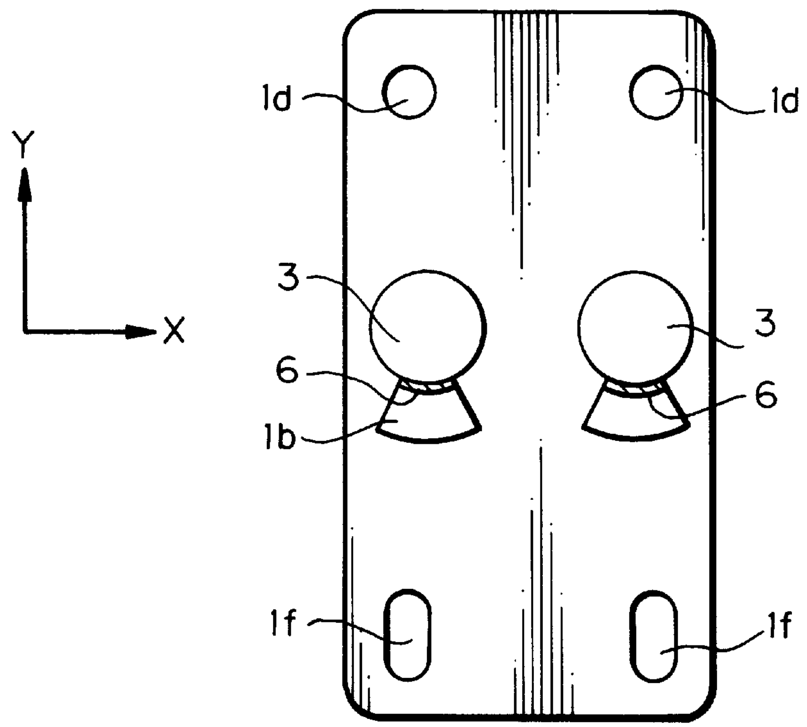
FIG. 34B is a front view of a base included in the fifteenth embodiment.

The accuracy required of the beam pitch is extremely high in the direction y, but not so high in the direction x. In light of this, as shown in FIG. 34B, only two lower bores 1*d* positioned side by side in the direction x may be implemented as the elongate slots 1*f*.

16th Embodiment

Figure 35B:
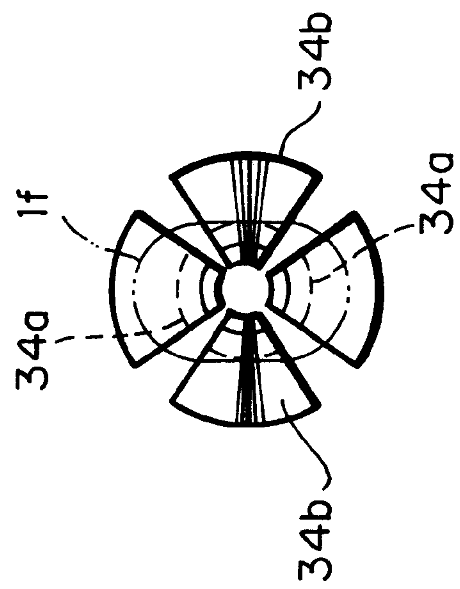
FIGS. 35A and 35B are fragmentary views showing a sixteenth embodiment of the present invention.
Figure 35A:
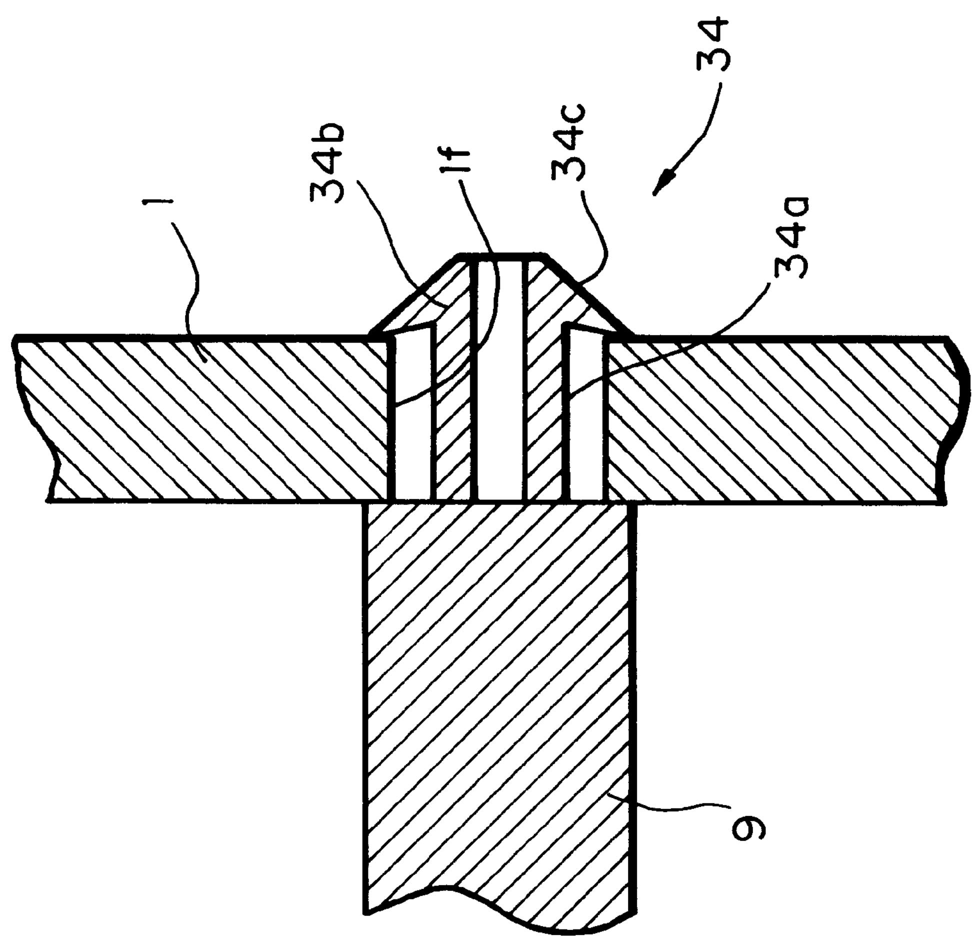

FIGS. 35A and 35B show a sixteenth embodiment of the present invention including an elastic lug 34 formed of a plastic in place of the screw 11. The lug 34 is molded integrally with the case 9 at the position where the female screw is formed. The lug 34 is made up of a plurality of (four in the embodiment) posts 34*a* arranged in an annular configuration, lock pieces 34*b* formed at the ends of the posts 34*a,* and guide slants 34*c* formed on the ends of the lock pieces 34*b*. The base 1 is formed with the elongate slot 1*f*. While the shank portion of the lug 34 constituted by the posts 34*a* has a diameter smaller than he longer diameter of the slot 1*f,* the head portion of the lug 34 constituted by the lock pieces 34*b* has a diameter greater than the shorter diameter of the slot 1*f*.

The base 1 is mounted to the case 9 by the following procedure. After the base 1 has been aligned with the case 9,. each lug 34 of the case 9 is inserted into the associated slot 1*f* of the base 1. When the base 1 is pressed against the case 9, the posts 34*a* of the lug 34 elastically bend inward at the same time due to the guide slants 34*c*. As a result, the lug 34 is passed through the slot 1*f* until its lock portions 34*b* protrude to the other side of the base 1. As a result, the posts 34*a* elastically restore their straight positions. In this condition, the base 1 is prevented from separating from the case 9 because the lock portions 34*b* have a greater diameter than the slot 1*f*. In addition, the base 1 is biased against the case 9 due to the elasticity of the lock pieces 34*a*. The base 1 and case 9 may be locked by the lug 34 at all of the four corners or at two or three of them; in the latter case, the lug 34 will be combined with the screw 11.

As described above, the third to sixteenth embodiments achieve the following advantage. When the distance between the collimator lenses increases in the beam pitch direction due to the thermal expansion of the base, the adhesive layer whose center is shifted outward expands in such a manner as to cancel the expansion of the base. This successfully reduces the displacement of the lenses in the beam pitch direction and thereby reduces the variation of the distance between the semiconductor lasers in the beam pitch direction.

Various modifications will become possible for those skilled in the art after receiving the teachings of the present disclosure without departing from the scope thereof.

What is claimed is:

1. A light source device comprising:

a base formed with a plurality of through bores;

a plurality of semiconductor lasers positioned at a rear side of said base and each being received in a respective through bore of said base;

a plurality of collimator lenses respectively adhered to a plurality of lens support portions formed on a front side of said base, said plurality of collimator lenses each being positioned coaxially with an optical axis of a respective semiconductor laser;

a plurality of apertures each for shaping a laser beam to issue from a respective collimator lens; and beam combining means for combining laser beams to respectively issue from said plurality of semiconductor lasers to thereby output laser beams lying substantially on a single optical axis;

said plurality of lens support portions each having a center line extending substantially perpendicularly to a beam pitch direction of the laser beams output from said plurality of collimator lenses.

2. A device as claimed in claim 1, wherein said lens support portions are molded integrally with said base, said collimator lenses being respectively directly affixed to said lens support portions by photo-curable adhesive.

3. A device as claimed in claim 2, wherein said lens support portions are positioned symmetrically with respect to a line perpendicular to the beam pitch direction.

4. A device as claimed in claim 3, wherein said lens support portions each has an arcuate section slightly greater in diameter than said collimator lenses.

5. A device as claimed in claim 4, wherein said arcuate section is smaller than a semicircle.

6. A device as claimed in claim 5, wherein a non-adhesion portion intervenes between said collimator lenses and said base in a direction of an optical axis.

7. A device as claimed in claim 3, wherein said lens support portions each has an arcuate section slightly greater in a radius of curvature than said collimator lenses by substantially a thickness of an adhesive layer.

8. A device as claimed in claim 7, wherein said arcuate section is smaller than a semicircle.

9. A device as claimed in claim 8, wherein a non-adhesion portion intervenes between said collimator lenses and said base in a direction of an optical axis.

10. A device as claimed in claim 1, wherein said lens support portions are positioned symmetrically with respect to a line perpendicular to the beam pitch direction.

11. A device as claimed in claim 1, wherein said lens support portions each has an arcuate section slightly greater in diameter than said collimator lenses.

12. A device as claimed in claim 1, wherein said lens support portions each has an arcuate section slightly greater in a radius of curvature than said collimator lenses by substantially a thickness of an adhesive layer.

13. A device as claimed in claim 1, wherein a non-adhesion portion intervenes between said collimator lenses and said base in a direction of an optical axis.

14. A device as claimed in claim 1, wherein said base comprises a first base and a second base separate from said first base, said first base comprising at least a through bore defining at least one beam optical axis, a semiconductor laser fitted in said through bore, a collimator lense coaxial with an optical axis of said semiconductor layer, and a lens support portion coaxial with said semiconductor layer, said second base comprising a through bore defining another beam optical axis, a semiconductor laser fitted in said through bore, a collimator lens coaxial with an optical axis of said collimator lens, and a lens support portion coaxial with said semiconductor layer.

15. A device as claimed in claim 14, wherein said lens support portions are respectively molded integrally with said first base and said second, said collimator lenses being respectively directly affixed to said lens support portions by photo-curable adhesive.

16. A device as claimed in claim 15, wherein said lens support portions are positioned symmetrically with respect to a line perpendicular to the beam pitch direction.

17. A device as claimed in claim 16, wherein said lens support portions each has an arcuate section slightly greater in diameter than said collimator lenses.

18. A device as claimed in claim 17, wherein said arcuate section is smaller than a semicircle.

19. A device as claimed in claim 18, wherein a non-adhesion portion intervenes between each of said collimator lenses and an associated one of said first base and said second base in a direction of an optical axis.

20. A device as claimed in claim 16, wherein said lens support portions each has an arcuate section slightly greater in a radius of curvature than said collimator lenses by substantially a thickness of an adhesive layer.

21. A device as claimed in claim 20, wherein said arcuate section is smaller than a semicircle.

22. A device as claimed in claim 21, wherein a non-adhesion portion intervenes between each of said collimator lenses and an associated one of said first base and said second base base in a direction of an optical axis.

23. A device as claimed in claim 14 wherein said lens support portions are positioned symmetrically with respect to a line perpendicular to the beam pitch direction.

24. A device as claimed in claim 14, wherein said lens support portions each has an arcuate section slightly greater in diameter than said collimator lenses.

25. A device as claimed in claim 14, wherein said lens support portions each has an arcuate section slightly greater in a radius of curvature than said collimator lenses by substantially a thickness of an adhesive layer.

26. A light source device comprising:

a plurality of semiconductor lasers;

a base formed with through bores for respectively press-fitting said semiconductor layers;

a plurality of lens support portions formed on said base;

a plurality of collimator lenses respectively adhered to said plurality of lens support portions via adhesive layers;

an optical element for combining laser beams output from said collimator lenses to thereby produce beams adjoining each other; and a case mounted to said base for covering said plurality of collimator lenses and said optical element;

said adhesive layers each having a center thereof shifted outward of a respective bore in a beam pitch direction, so that said adhesive layers each thermally expands inward.

27. A device as claimed in claim 26, wherein said adhesive layers each is arcuate and coaxial with a respective through bore.

* * * * *